United States Patent
Yahata et al.

(10) Patent No.: US 8,247,823 B2
(45) Date of Patent: Aug. 21, 2012

(54) LIGHT-EMITTING ELEMENT

(75) Inventors: Kosuke Yahata, Kiyosu (JP); Naoki Nakajo, Kiyosu (JP); Masao Kamiya, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 88 days.

(21) Appl. No.: 12/923,384

(22) Filed: Sep. 17, 2010

(65) Prior Publication Data

US 2011/0068359 A1    Mar. 24, 2011

(30) Foreign Application Priority Data

Sep. 18, 2009    (JP) ................................. 2009-217231

(51) Int. Cl.
*H01L 27/15*    (2006.01)
*H01L 27/148*    (2006.01)
*H01L 21/00*    (2006.01)

(52) U.S. Cl. ............ 257/79; 257/88; 257/225; 257/228; 257/290; 257/291; 257/414; 257/E51.018; 257/E51.022; 257/E51.206; 257/E33.001; 438/22; 438/24; 438/46

(58) Field of Classification Search ................. 257/222, 257/225, 228, 290, 291, 414, E51.018, E51.022, 257/E51.026, E33.001, E25.019, E25.028, 257/79, 80, 88–90; 438/22, 24, 29, 37, 46, 438/47; 313/504, 506; 428/690, 917
See application file for complete search history.

(56) References Cited

U.S. PATENT DOCUMENTS 6,828,596 B2   12/2004   Steigerwald et al.
7,592,633 B2 *   9/2009   Shakuda ........................ 257/88

FOREIGN PATENT DOCUMENTS

JP    2008-288548 A    11/2008

* cited by examiner

*Primary Examiner* — Hsien Ming Lee
(74) *Attorney, Agent, or Firm* — McGinn IP Law Group, PLLC

(57) ABSTRACT

A light-emitting element includes a semiconductor laminated structure including a first semiconductor layer, a light-emitting layer and a second semiconductor layer, an insulation layer provided on the semiconductor laminated structure, a first wiring including a first vertical conducting portion and a first planar conducting portion and being electrically connected to the first semiconductor layer, the first vertical conducting portion extending inside the insulation layer, the light-emitting layer and the second semiconductor layer in a vertical direction and the first planar conducting portion extending inside the insulation layer in a planar direction, and a second wiring including a second vertical conducting portion and a second planar conducting portion and being electrically connected to the second semiconductor layer, the second vertical conducting portion extending inside the insulation layer in a vertical direction and the second planar conducting portion extending inside the insulation layer in a planar direction.

20 Claims, 18 Drawing Sheets

1 LIGHT-EMITTING ELEMENT
40 p-SIDE ELECTRODE
42 n-SIDE ELECTRODE
70 p-SIDE WIRING
72 n-SIDE WIRING
90 p-SIDE BONDING ELECTRODE
92 n-SIDE BONDING ELECTRODE

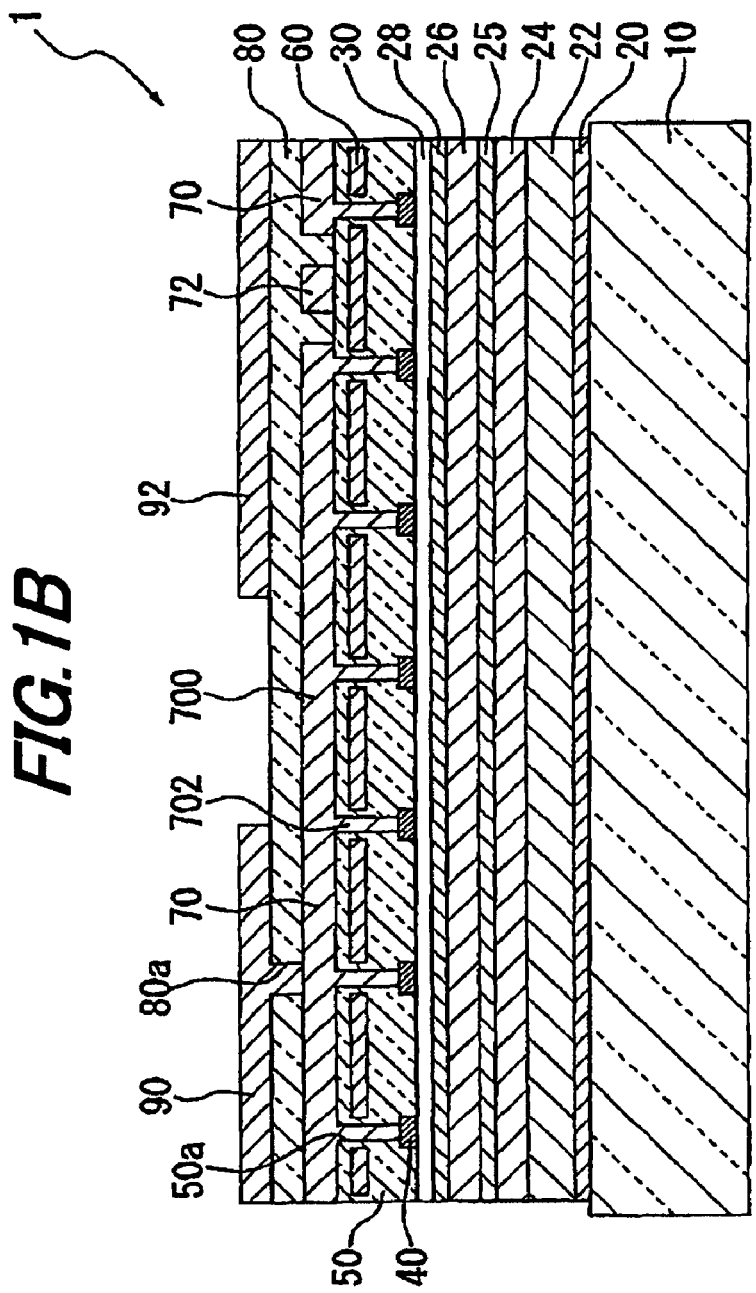

FIG.2A
(a)
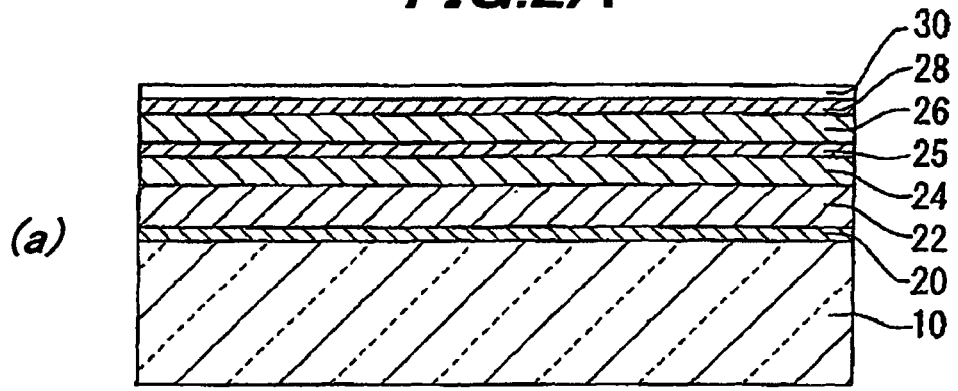
(b)
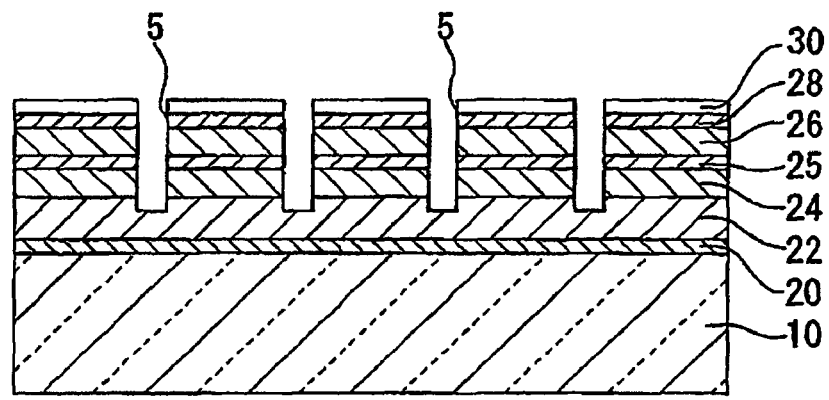
(c)
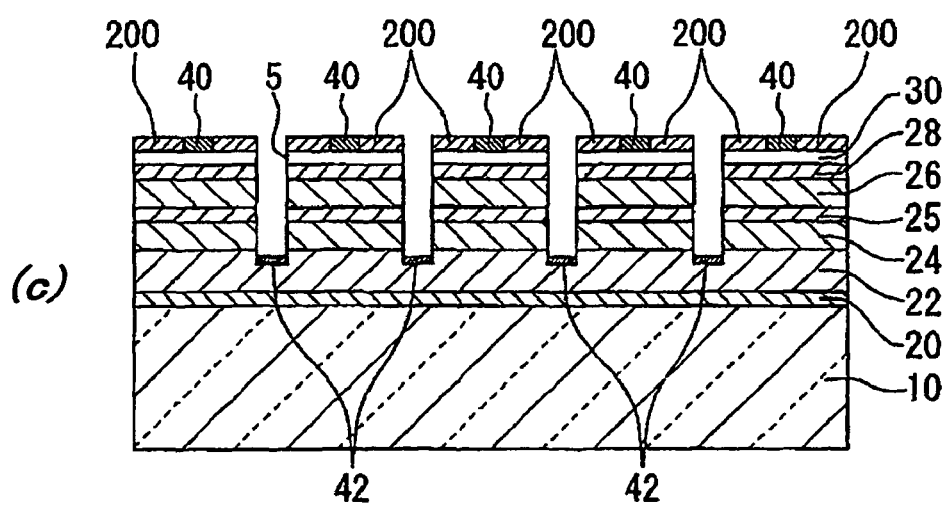
| 5 VIA |
|---|
| 200 MASK |

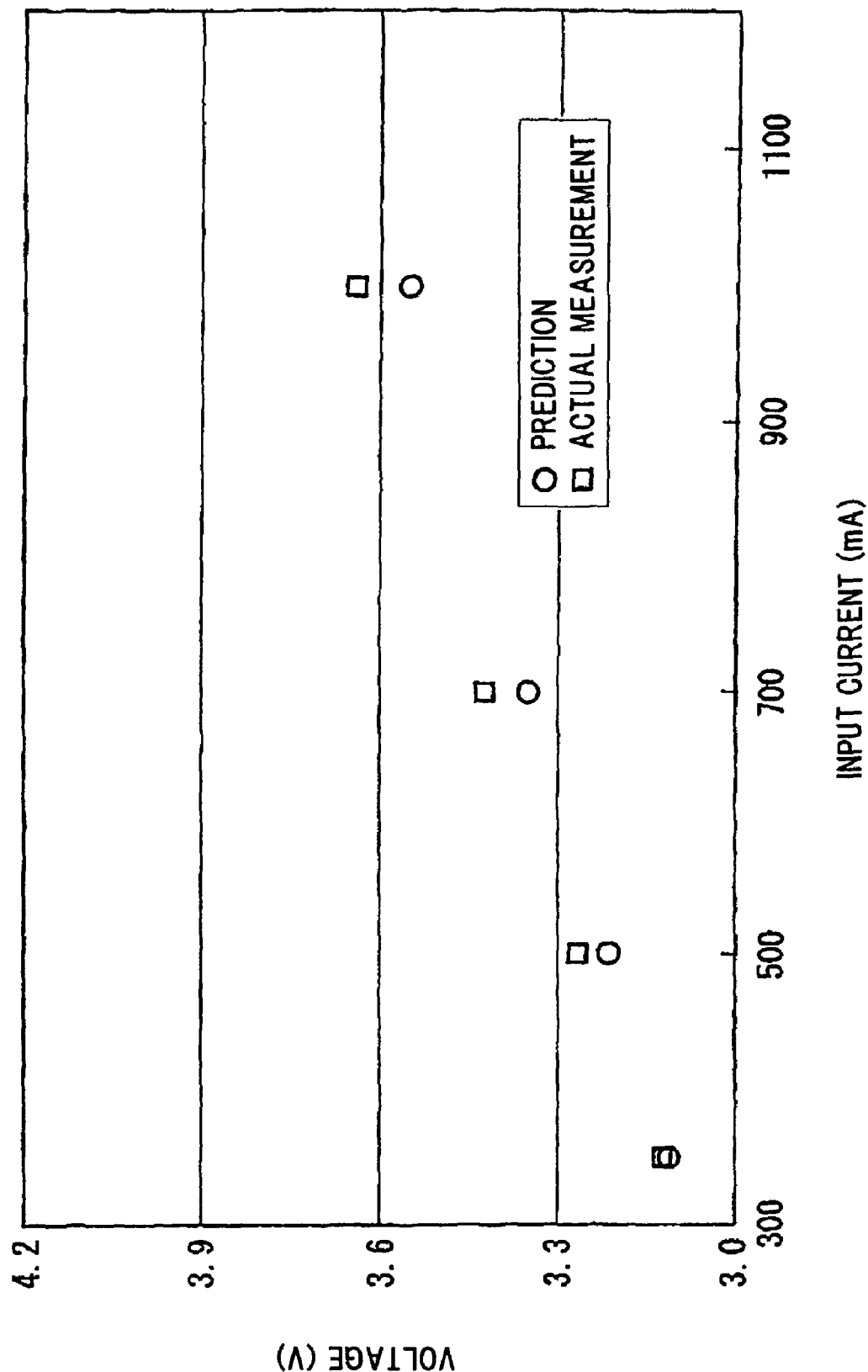

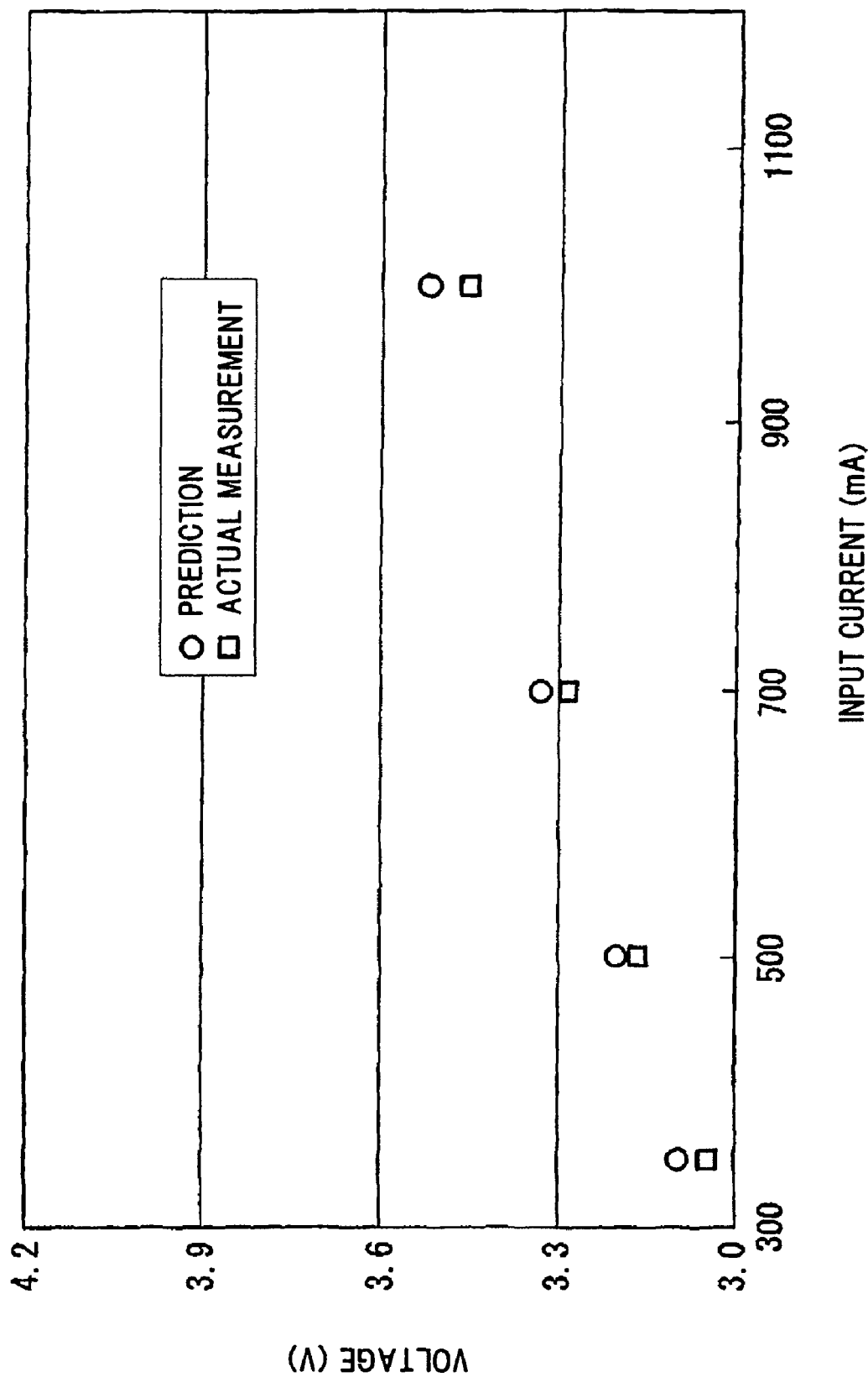

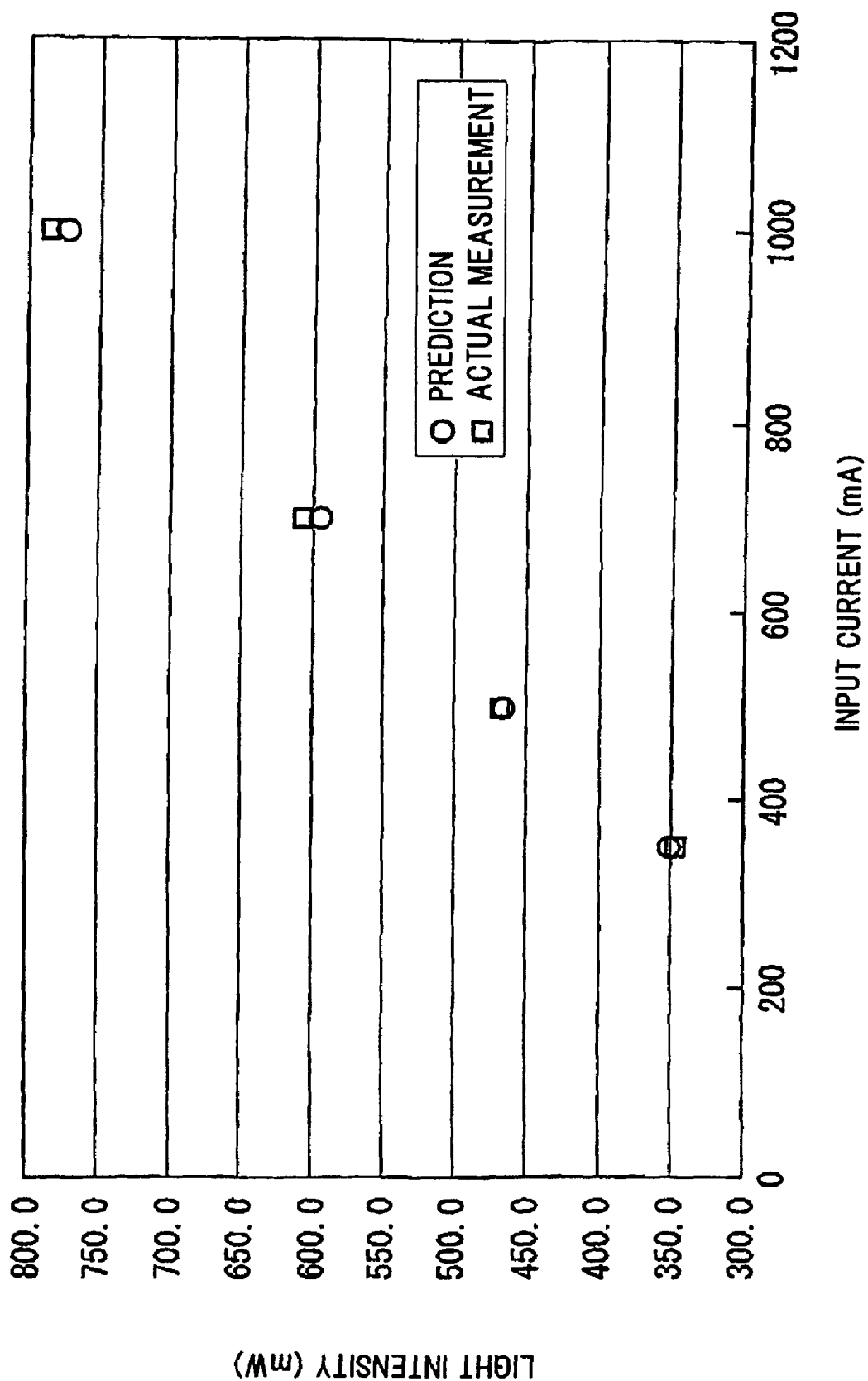

LIGHT-EMITTING ELEMENT

The present application is based on Japanese Patent Application No. 2009-217231 filed on Sep. 18, 2009, the entire contents of which are incorporated herein by reference.

BACKGROUND OF THE INVENTION

1. Field of the Invention

The invention relates to a flip chip type light-emitting element.

2. Description of the Related Art

A conventional semiconductor light emitting element is known which is provided with a diffusion electrode formed on a semiconductor layer, a passivation film with an opening on a portion thereof for coating a surface of the diffusion electrode and a bonding electrode having a solder layer on an upper surface thereof, and in which a buffer electrode with a diameter larger than the opening and having a surface flatter than that of the diffusion electrode is formed at the bottom of the opening of the passivation film on the surface of the diffusion electrode and the bonding electrode is connected to the buffer electrode (e.g., JP-A-2008-288548).

In the semiconductor light emitting element described in JP-A-2008-288548, the buffer electrode is formed on the surface of the diffusion electrode, an opening smaller than the buffer electrode is formed on the passivation film above the buffer electrode and the surface of the buffer electrode is flat, hence, it is possible to ensure adhesion between the buffer electrode and the passivation film, and progress of etching in a lateral direction from an interface between the buffer electrode and the passivation film can be suppressed.

SUMMARY OF THE INVENTION

However, improvement in degree of freedom for arranging the bonding electrode is limited in the semiconductor light emitting element described in JP-A-2008-288548 since p- and n-electrodes as an ohmic electrode are electrically connected to the bonding electrode through a via provided immediately above the p- and n-electrodes. Particularly, when the p- and n-electrodes are arranged in a complicated manner or in a complex shape, the arrangement of the bonding electrode is likely to be complicated as well.

Therefore, it is an object of the invention to provide a light-emitting element which allows a high degree of freedom in designing arrangement and shape of a bonding electrode even though arrangement and shape of an ohmic electrode is complicated.

(1) According to one embodiment of the invention, a light-emitting element comprises:

a semiconductor laminated structure comprising a nitride compound semiconductor, the semiconductor laminated structure including a first semiconductor layer of a first conductivity type, a light-emitting layer and a second semiconductor layer of a second conductivity type different from the first conductivity type;

an insulation layer provided on the semiconductor laminated structure;

a first wiring comprising a first vertical conducting portion and a first planar conducting portion and being electrically connected to the first semiconductor layer, the first vertical conducting portion extending inside the insulation layer, the light-emitting layer and the second semiconductor layer in a vertical direction and the first planar conducting portion extending inside the insulation layer in a planar direction; and a second wiring comprising a second vertical conducting portion and a second planar conducting portion and being electrically connected to the second semiconductor layer, the second vertical conducting portion extending inside the insulation layer in a vertical direction and the second planar conducting portion extending inside the insulation layer in a planar direction.

In the above embodiment (1) of the invention, the following modifications and changes can be made.

(i) The light-emitting element further comprises:

a first bonding electrode provided on the insulation layer and electrically connected to the first wiring; and a second bonding electrode provided on the insulation layer and electrically connected to the second wiring.

(ii) A reflective layer for reflecting light emitted from the light-emitting layer is included inside the insulation layer.

(iii) The first and second planar conducting portions are provided on the same plane.

(iv) The first and second planar conducting portions are provided on different planes.

(v) The first and second bonding electrodes are provided on the same plane.

(vi) The light-emitting element further comprises:

a first ohmic electrode being in ohmic contact with the first semiconductor layer;

a transparent conductive layer being in ohmic contact with the second semiconductor layer; and a second ohmic electrode being in ohmic contact with the transparent conductive layer, wherein the first wiring is electrically connected to the first ohmic electrode; and the second wiring is electrically connected to the second ohmic electrode.

(vii) A material constituting the first ohmic electrode is the same as a material constituting the second ohmic electrode.

(viii) A material constituting the first wiring is the same as a material constituting the second wiring.

(ix) The first and second bonding electrodes each have notches in plan view.

Points of the Invention

According to one embodiment of the invention, a light-emitting element is constructed such that an electrode in ohmic contact with a compound semiconductor (i.e., a p-electrode and an n-electrode) is separated, in a thickness direction of the light-emitting element, from a wiring for supplying current to the electrode (i.e., a p-side wiring and an n-side wiring) by a lower insulation layer which is in contact with a transparent conductive layer. As a result, it is possible to independently provide plural p-side electrodes and plural n-side electrodes on the semiconductor layer, and the p-side electrodes can be electrically connected each other by the p-side wiring through a via located above each p-side electrode, and the plural n-side electrodes can be electrically connected through a via located above each n-side electrode. Thus, it is possible to freely design the shape and arrangement of a p-side bonding electrode and an n-side bonding electrode regardless of the shape and arrangement of the p-electrode and n-electrode.

BRIEF DESCRIPTION OF THE DRAWINGS

Next, the present invention will be explained in more detail in conjunction with appended drawings, wherein:

FIG. 1B is a vertical cross sectional view showing the light-emitting element in the first embodiment of the invention;

FIG. 2A is a schematic view showing a manufacturing process of the light-emitting element in the first embodiment of the invention;

FIG. 9B is a view showing a comparison between a prediction and an actual measurement value of forward voltage with respect to an input current to the light-emitting element;

FIG. 10B is a view showing a comparison between a prediction and an actual measurement value of forward voltage with respect to an input current to the light-emitting element of the modification 1;

FIG. 11A is a view showing a comparison between a prediction and an actual measurement value of light intensity with respect to an input current to the light-emitting element of the modification 2.

DETAILED DESCRIPTION OF THE PREFERRED EMBODIMENTS

First Embodiment

Figure 1A:
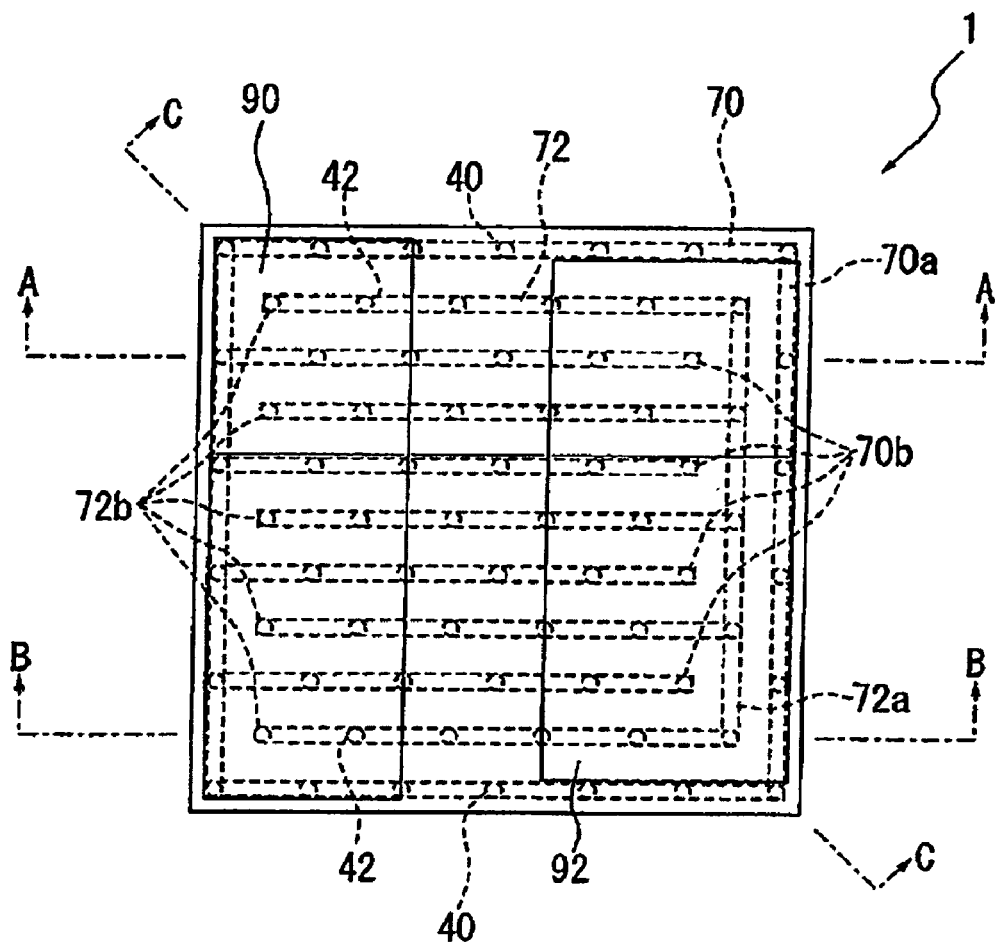
FIG. 1A is a plan view showing a light-emitting element in a first embodiment of the present invention.
Figure 1C:
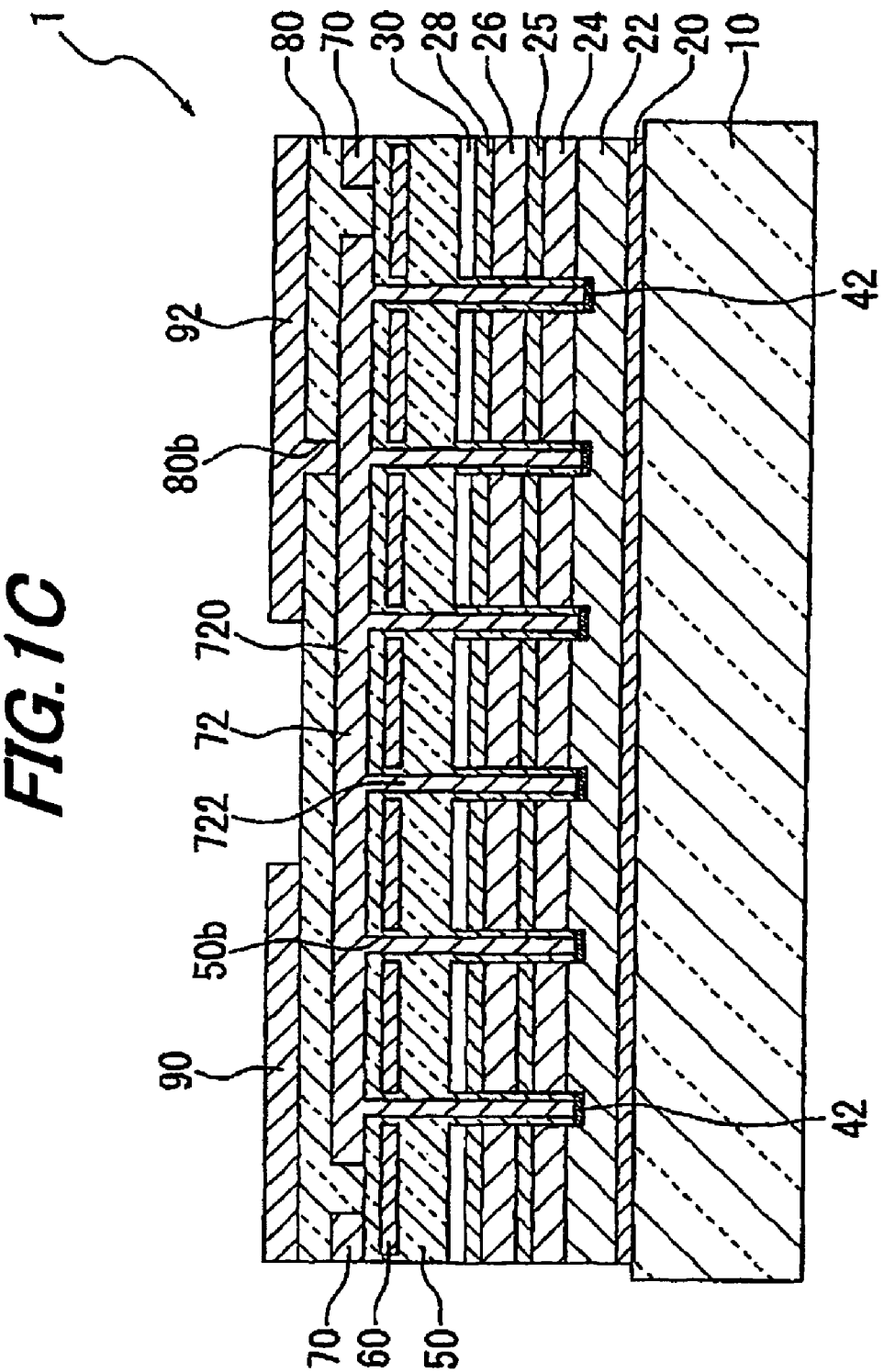
FIG. 1C is a vertical cross sectional view showing the light-emitting element in the first embodiment of the invention.

FIG. 1A schematically shows an upper surface of a light-emitting element in a first embodiment of the invention and FIGS. 1B and 1C show schematic vertical cross sectional views of the light-emitting element in the first embodiment of the invention. In detail, FIG. 1B shows a vertical schematic cross sectional view of the light-emitting element taken on line A-A of FIG. 1A and FIG. 1C shows a vertical schematic cross sectional view of the light-emitting element taken on line B-B of FIG. 1A.

Structure of Light-emitting Element 1

As shown in FIGS. 1B and 1C, a light-emitting element 1 in the first embodiment of the invention has a semiconductor laminated structure including, e.g., a sapphire substrate 10 having a C-plane (0001), a buffer layer 20 provided on the sapphire substrate 10, an n-side contact layer 22 provided on the buffer layer 20, an n-side cladding layer 24 provided on the n-side contact layer 22, a light-emitting layer 25 provided on the n-side cladding layer 24, a p-side cladding layer 26 provided on the light-emitting layer 25 and a p-side contact layer 28 provided on the p-side cladding layer 26.

In addition, the light-emitting element 1 is provided with a transparent conductive layer 30 provided on the p-side contact layer 28 and plural p-electrodes 40 provided in portions of a region on the transparent conductive layer 30. In addition, the light-emitting element 1 is provided with plural n-electrodes 42 provided on the n-side contact layer 22 exposed by plural vias which are formed from the p-side contact layer 28 to at least a surface of the n-side contact layer 22, a lower insulation layer 50 provided on an inner surface of the via and on the transparent conductive layer 30, and a reflective layer 60 provided inside the lower insulation layer 50. The reflective layer 60 is provided in a portion excluding portions above the p-electrodes 40 and the n-electrodes 42.

Furthermore, the lower insulation layer 50 which is in contact with the transparent conductive layer 30 has a via 50a extending in a vertical direction on each p-electrode 40 and a via 50b extending in a vertical direction above each n-electrode 42. In addition, a p-wiring 70 and an n-wiring 72 are provided on the lower insulation layer 50 in the light-emitting element 1. The p-wiring 70 has a second planar conducting portion 700 extending in a planar direction on the lower insulation layer 50 and plural second vertical conducting portions 702 electrically connected to each of the p-electrodes 40 through the vias 50a. Meanwhile, the n-wiring 72 has a first planar conducting portion 720 extending in a planar direction on the lower insulation layer 50 and plural first vertical conducting portions 722 electrically connected to each of the n-electrodes 42 through the vias 50b in the lower insulation layer 50 and vias formed in the semiconductor laminated structure. Furthermore, the light-emitting element 1 is provided with an upper insulation layer 80 provided on the lower insulation layer 50 which is in contact with the p-wiring 70, the n-wiring 72 and the transparent conductive layer 30, a p-side bonding electrode 90 electrically connected to the p-wiring 70 through a p-side opening 80a provided in the upper insulation layer 80, and an n-side bonding electrode 92 electrically connected to the n-wiring 72 through an n-side opening 80b provided in the upper insulation layer 80.

In the present embodiment, the second planar conducting portion 700 of the p-wiring 70 and the first planar conducting portion 720 of the n-wiring 72 are each formed on the surface of the lower insulation layer 50 which is in contact with the transparent conductive layer 30, and thus are provided on the same plane. Meanwhile, in the present embodiment, the p-side bonding electrode 90 and the n-side bonding electrode 92 are formed on the surface of the upper insulation layer 80, and thus are provided on the same plane.

Semiconductor Laminated Structure

Here, the buffer layer 20, the n-side contact layer 22, the n-side cladding layer 24, the light-emitting layer 25, the p-side cladding layer 26 and the p-side contact layer 28 are each formed of a group III nitride compound semiconductor.

For the group III nitride compound semiconductor, it is possible to use, e.g., a quaternary group III nitride compound semiconductor represented by $Al_xGa_yIn_{1-x-y}N$ ($0 \leq x \leq 1$, $0 \leq y \leq 1$, and $0 \leq x+y \leq 1$).

In the present embodiment, the buffer layer 20 is formed of AlN. The n-side contact layer 22 and the n-side cladding layer 24 are each formed of n-GaN doped with respective predetermined amounts of n-type dopant (e.g., Si). Meanwhile, the light-emitting layer 25 has a multiquantum well structure including plural well layers and plural barrier layers. The light-emitting layer 25 is formed of, e.g., GaN, InGaN or AlGaN, etc. In addition, the p-side cladding layer 26 and the p-side contact layer 28 are each formed of p-GaN doped with a predetermined amount of p-type dopant (e.g., Mg).

Transparent Conductive Layer 30, p-Electrode 40 and n-Electrode 42

The transparent conductive layer 30 is formed of conductive oxide. The transparent conductive layer 30 can be formed of, e.g., ITO (Indium Tin Oxide). Meanwhile, a material constituting the p-electrode 40 is the same as a material constituting the n-electrode 42. Note that, when the p-electrode 40 and the n-electrode 42 are formed of multiple layers, each has the same layer structure. The p-electrode 40 and the n-electrode 42 are formed of a metal material containing, e.g., Ni or Cr, and Au and Al. Specifically, when the n-side contact layer 22 is formed of n-type GaN, the n-electrode 42 can be formed from the n-side contact layer 22 side including a Ni layer as a contact layer, or can be formed from the n-side contact layer 22 side including a Cr layer as a contact layer. Meanwhile, specifically when the transparent conductive layer 30 is formed of an oxide semiconductor, the p-electrode 40 can be formed from the transparent conductive layer 30 side including a Ni layer as a contact layer, or can be formed from the transparent conductive layer 30 side including a Cr layer as a contact layer. In detail, the p-electrode 40 and the n-electrode 42 can be formed including a Ni layer, an Au layer and an Al layer respectively from the transparent conductive layer 30 side and from the n-side contact layer 22 side.

Additionally, the plural p-electrodes 40 are regularly arranged on the transparent conductive layer 30 in the present embodiment. Likewise, the plural n-electrodes 42 are regularly arranged on a plane which is different, in a thickness direction of the light-emitting element 1, from the plane having the plural p-electrodes 40 provided thereon (e.g., on an exposed surface of the n-side contact layer 22). In detail, as shown by dashed lines in FIG. 1A, the plural p-electrodes 40 are arranged at intervals along first and second axes when determining one side of the light-emitting element 1 as a first axis and assuming a side perpendicular to the above-mentioned one side as a second axis. In the present embodiment, the plural p-electrodes 40 are arranged at positions corresponding to lattice points of lattices having a predetermined lattice interval. Meanwhile, the plural n-electrodes 42 are arranged at intervals at positions not overlapping each of the p-electrodes 40 in plan view. In the present embodiment, each of the plural n-electrodes 42 is placed at the face center position of a square as the minimum square which is defined by four p-electrodes 40 arranged at four corners in plan view (i.e., at an intersection of two diagonal lines of the square). In other words, the p-electrodes 40 and the n-electrodes 42 are arranged at alternate positions with respect to the first and second axes.

The p-electrode 40 and the n-electrode 42 can each have a substantially circular or polygonal shape (i.e., triangle, quadrangle, pentagon and hexagon, etc.) in plan view and the size of each p-electrode 40 and each n-electrode 42 in plan view can be determined in the light of arrangement of each electrode and improvement of a ratio of light emitting region area (hereinafter referred to as "light-emitting area") to the total area of the light-emitting element 1 in plan view. When the p-electrode 40 and the n-electrode 42 have, e.g., a substantially circular shape in plan view, the p-electrode 40 and the n-electrode 42 can have a diameter of not less than 5 μm and not more than 50 μm. Particularly for the purpose of improving the ratio of the light-emitting area to the total area of the light-emitting element 1, the n-electrode 42 can have a diameter of not less than 5 μm and not more than 30 μm, and can have a diameter of not less than 5 μm and not more than 20 μm in order to further increase the light-emitting area.

Lower Insulation Layer 50 and Reflective Layer 60

The lower insulation layer 50 is formed including the reflective layer 60 which reflects light emitted from the light-emitting layer 25. The lower insulation layer 50 is formed mainly of, e.g., silicon dioxide ($SiO_2$) as an insulating material. Meanwhile, the reflective layer 60 is formed of a metal material which reflects the light emitted from the light-emitting layer 25, e.g., Al.

p-Side Wiring 70 and n-Side Wiring 72

Each of the p-side wiring (hereinafter p-wiring) 70 and the n-side wiring (hereinafter n-wiring) 72 can be formed containing mainly Ti, Au and Al. Each of the p-wiring 70 and the n-wiring 72 can be formed including, e.g., a Ti layer, an Au layer and an Al layer in this order from the side in contact with the lower insulation layer 50.

In addition, the p-wiring 70 has an outer peripheral portion 70a provided near and along an outer periphery of the light-emitting element 1 when the light-emitting element 1 is viewed from the top, as shown in FIG. 1A. The p-wiring 70 further has plural p-side thin line portions 70b extending from one side of the outer peripheral portion 70a toward an opposite side thereof. The plural p-side thin line portions 70b have substantially the same length in a longitudinal direction without being in contact with the above-mentioned opposite side, and are arranged at substantially equal intervals in a width direction.

Meanwhile, when the light-emitting element 1 is viewed from the top, the n-wiring 72 has a side portion 72a which extends in a direction perpendicular to the plural p-side thin line portions 70b and is arranged inside the outer peripheral portion 70a near the above-mentioned opposite side of the outer peripheral portion 70a, and plural n-side thin line portions 72b extending from the side portion 72a toward the above-mentioned one side. The plural n-side thin line portions 72b are each arranged between the outer peripheral portion 70a and the p-side thin line portion 70b or between two p-side thin line portions 70b at a position where the distance from the nearest outer peripheral portion 70a and the distance from the nearest p-side thin line portion 70b in plan view are substantially the same. Therefore, the plural p-side thin line portions 70b and the plural n-side thin line portions 72b are alternately arranged in plan view.

Then, as shown in FIGS. 1B and 1C, the p-wiring 70 and the n-wiring 72 are electrically isolated by placing the upper insulation layer 80 between the second planar conducting portion 700 and the first planar conducting portion 720 in a planar direction. An ohmic electrode function and a wiring function are separated by providing the p-wiring 70 and the n-wiring 72 between the lower insulation layer 50 and the upper insulation layer 80 aside from the p-electrode 40 and the n-electrode 42 which are in ohmic contact with a compound semiconductor layer. The upper insulation layer 80 can be formed of the same material as the lower insulation layer 50 which is in contact with the transparent conductive layer 30, and the upper insulation layer 80 and the lower insulation layer 50 integrally form an insulation layer.

p-Side Bonding Electrode 90 and n-Side Bonding Electrode 92

The p-side bonding electrode 90 and the n-side bonding electrode 92 can be formed each including an eutectic material, e.g., AuSn. The p-side bonding electrode 90 and the n-side bonding electrode 92 are each formed in a substantially rectangular shape in plan view. As for the size of the p-side bonding electrode 90 and the n-side bonding electrode 92 in plan view, the area of the p-side bonding electrode 90 can be larger than that of the n-side bonding electrode 92. The shapes and areas of the p-side bonding electrode 90 and the n-side bonding electrode 92 in plan view can be appropriately changed depending on the way of contact with a probe of a measuring device used for evaluating characteristics of the light-emitting element 1 and/or a mounting substrate for mounting the light-emitting element 1, etc.

In addition, the p-side bonding electrode 90 and the n-side bonding electrode 92 can be formed by, e.g., a vacuum deposition method (e.g., a beam deposition method or a resistance heating deposition method, etc.), a sputtering method, a plating method or a screen printing method, etc. Alternatively, the p-side bonding electrode 90 and the n-side bonding electrode 92 can be formed of eutectic solder consisting of an eutectic material other than AuSn or Pb-free solder such as SnAgCu. In addition, the p-side bonding electrode 90 and the n-side bonding electrode 92 can be formed having a barrier layer and a solder layer from the p-wiring 70 side and the n-wiring 72 side.

In detail, the barrier layer can be formed including a first barrier layer which is in contact with the p-wiring 70 and the n-wiring 72, and a second barrier layer for suppressing diffusion of the material constituting the solder layer. The first barrier layer is formed of a material with good adhesion and in ohmic contact with the materials constituting the p-wiring 70 and the n-wiring 72, e.g., is formed mainly of Ti. Meanwhile, the second barrier layer is formed of a material capable of suppressing the diffusion of the material constituting the solder layer to the p-wiring 70 side and the n-wiring 72 side, e.g., is formed mainly of Ni. It should be noted that the material constituting the p-side bonding electrode 90 can be the same as the material constituting the n-side bonding electrode 92.

The light-emitting element 1 configured as described above is a flip-chip light-emitting diode (LED) which emits light with a wavelength in a blue region. The light-emitting element 1 emits, e.g., light having a peak wavelength of about 455 nm when forward voltage is about 3V and forward current is 350 mA. In addition, the light-emitting element 1 is formed in a substantially quadrangle shape in a plane view. A planar size of the light-emitting element 1 is, e.g., substantially 1000 μm in length and width.

Each layer provided on the sapphire substrate 10, from the buffer layer 20 to p-side contact layer 28, can be formed by, e.g., metalorganic chemical vapor deposition (MOCVD) method, molecular beam epitaxy (MBE) method or halide vapor phase epitaxy (HVPE) method, etc. The buffer layer 20 formed of AlN is shown as an example here, however, the buffer layer 20 can be formed of GaN. Meanwhile, the transparent conductive layer 30 can have a single quantum well structure or a strained quantum-well structure instead of the multiquantum well structure.

Alternatively, the lower insulation layer 50 and the upper insulation layer 80 can be formed of metal oxide such as titanium oxide ($TiO_2$), alumina ($Al_2O_3$) or tantalum pentoxide ($Ta_2O_5$), or a resin material having electrical insulation properties such as polyimide. Meanwhile, the reflective layer 60 can be formed of Ag, or an alloy consisting primarily of Al or Ag. Additionally, the reflective layer 60 may be a distributed bragg reflector (DBR) formed of plural layers of two materials having different refractive indexes.

Furthermore, the light-emitting element 1 may be a LED which emits light having a peak wavelength in an ultraviolet, near-ultraviolet or green region, however, the region of the peak wavelength of the light emitted by the LED is not limited thereto. The planar size of the light-emitting element 1 is not limited thereto in other modifications. The planar size of the light-emitting element 1 can be designed to be, e.g., 300 μm in length and width, or the length and width can be different each other. Alternatively, a compact light-emitting element 1 of about 100 μm in length and/or width can be formed by using this structure.

In addition, although the second planar conducting portion 700 of the p-wiring 70 and the first planar conducting portion 720 of the n-wiring 72 are provided on the same plane in the present embodiment, the second planar conducting portion 700 and the first planar conducting portion 720 can be formed on different planes. The height of the plane for providing the n-wiring 72 can be increased or lowered than the plane for providing the p-wiring 70 by, e.g., changing the thickness of the lower insulation layer 50 which is in contact with the transparent conductive layer 30. As a result, the second planar conducting portion 700 and the first planar conducting portion 720 can be arranged to overlap in plan view, thereby improving the degree of freedom for designing the element. Furthermore, the size of the p-electrode 40 and the n-electrode 42 in plan view is not limited to the above-mentioned example. In addition, the arrangement of the p-electrode 40 and the n-electrode 42 is not limited to the above-mentioned example, neither.

Manufacturing Process of the Light-Emitting Element 1

Figure 2B:
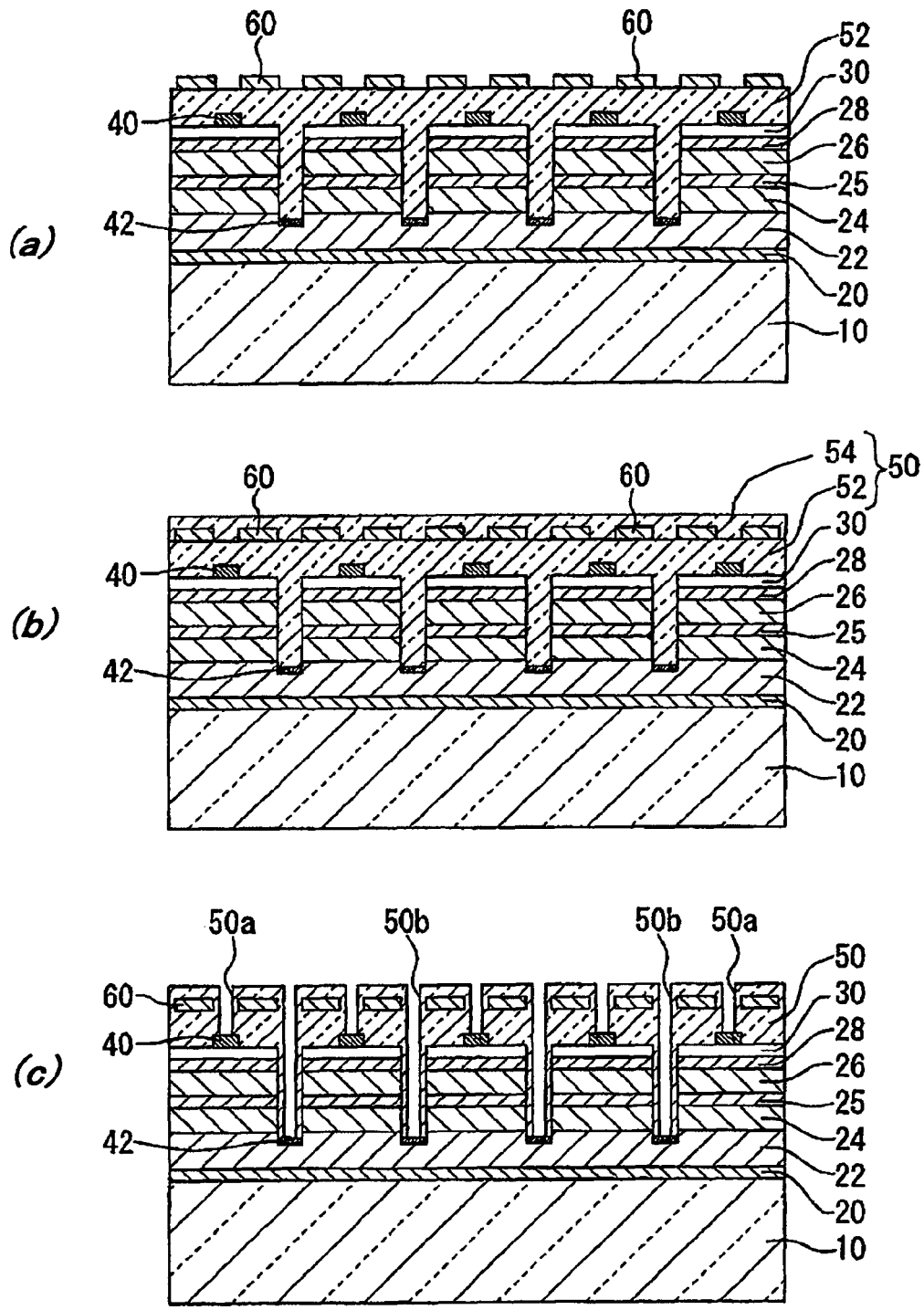
FIG. 2B is a schematic view showing a manufacturing process of the light-emitting element in the first embodiment of the invention.
Figure 2C:
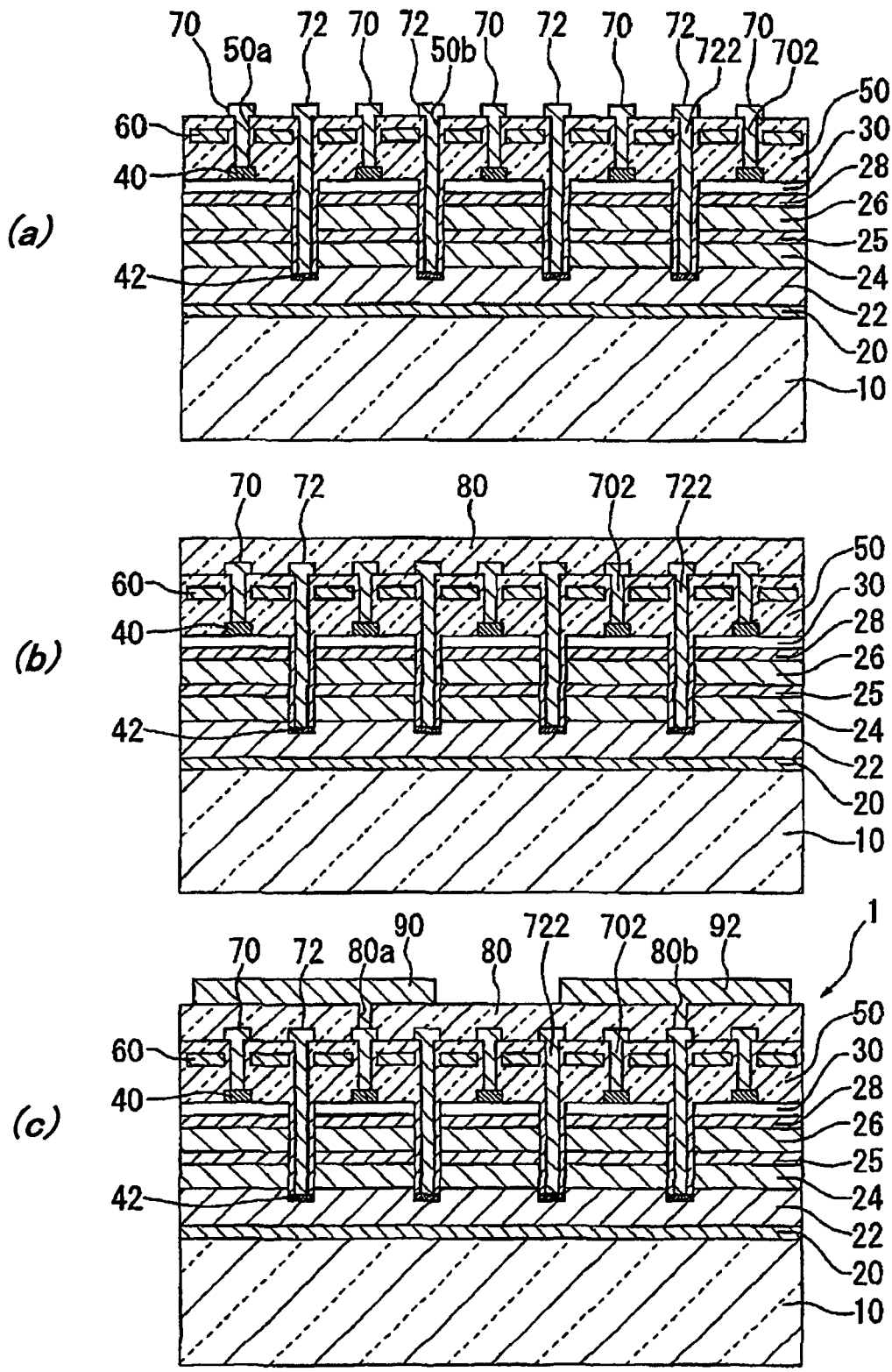
FIG. 2C is a schematic view showing a manufacturing process of the light-emitting element in the first embodiment of the invention.

FIGS. 2A to 2C show an example of manufacturing processes of the light-emitting element in the first embodiment. In detail, FIG. 2A(a) is a vertical cross sectional view before etching for forming vias is performed. FIG. 2A(b) is a vertical cross sectional view after the etching for forming vias is performed. In addition, FIG. 2A(c) is a vertical cross sectional view showing the state in which p- and n-electrodes are formed. It should be noted that FIGS. 2A to 2C are an example of the manufacturing process of the light-emitting element, showing a cross section taken along line C-C of FIG. 1A.

Firstly, the sapphire substrate 10 is prepared, and a semiconductor laminated structure which includes an n-type semiconductor layer, a light-emitting layer and a p-type semiconductor layer is formed on the sapphire substrate 10. In detail, the buffer layer 20, the n-side contact layer 22, the n-side cladding layer 24, the light-emitting layer 25, the p-side cladding layer 26 and the p-side contact layer 28 are epitaxially grown in this order on the sapphire substrate 10, thereby forming an epitaxial growth substrate (a semiconductor laminated structure forming process). Subsequently, the transparent conductive layer 30 is formed on the entire surface of the p-side contact layer 28 (FIG. 2A(a), a transparent conductive layer forming process). In the present embodiment, the transparent conductive layer 30 is formed of ITO. The transparent conductive layer 30 is formed using, e.g., a vacuum deposition method. Alternatively, it is possible to form the transparent conductive layer 30 by a sputtering method, a CVD method or a sol-gel method, etc.

Following this, a mask of photoresist is formed on the transparent conductive layer 30 using photolithography technique. Then, the region of the transparent conductive layer 30 as well as from the p-side contact layer 28 down to the surface of the n-side contact layer 22 excluding a portion having the mask formed thereon is etched, and subsequently, the mask is removed (a via forming process). This results in forming a substrate with a transparent conductive layer having vias 5 which are formed by removing from the surface of the transparent conductive layer 30 down to the n-side contact layer 22 (FIG. 2A(b)). Alternatively, in the via forming process, the etching can be performed down to a portion of the n-side contact layer 22 so that the portion not having the mask formed thereabove is completely removed from the n-side cladding layer 24 to the p-side contact layer 28.

After that, a mask 200 of photoresist is formed on a region excluding a region for forming the p-electrode 40 and the vias 5. Then, the p-electrode 40 and n-electrode 42 are formed using the vacuum deposition method (FIG. 2A(c), an electrode forming process). In the present embodiment, the material constituting the p-electrode 40 is the same as the material constituting the n-electrode 42. In other words, the electrode material is deposited on a surface of the transparent conductive layer 30 not having the mask 200 formed thereon as well as on a surface of the n-side contact layer 22 exposed by the via 5 at the same time, thereby forming the p-electrode 40 and n-electrode 42 which are formed of the same material. After forming the p-electrode 40 and n-electrode 42, it is possible to perform heat treatment at a predetermined temperature for a predetermined period of time in a predetermined atmosphere in order to ensure ohmic contact and adhesion between the transparent conductive layer 30 and the p-electrode 40 and between the n-side contact layer 22 and the n-electrode 42. Alternatively, the material constituting the p-electrode 40 can be different from that constituting the n-electrode 42. In this case, the p-electrode 40 and n-electrode 42 are formed not simultaneously but separately.

FIG. 2B(a) is a vertical cross sectional view after forming a first insulation layer and a reflective layer. Meanwhile, FIG. 2B(b) is a vertical cross sectional view after forming a second insulation layer. In addition, FIG. 2B(c) is a vertical cross sectional view after forming vias.

Firstly, a first insulation layer 52 covering the p-electrode 40 and n-electrode 42 is formed. The first insulation layer 52 is formed by the vacuum deposition method (a first insulation layer forming process). Then, the reflective layer 60 is formed in a predetermined region on the first insulation layer 52 excluding portions above the p-electrode 40 and n-electrode 42 by using the vacuum deposition method and the photolithography technique (FIG. 2B(a), a reflective layer forming process).

Next, a second insulation layer 54 is formed on the reflective layer 60 and on a portion of the first insulation layer 52 not having the reflective layer 60 formed thereon by using the vacuum deposition method (FIG. 2B(b), a second insulation layer forming process). As a result, the reflective layer 60 is covered with the second insulation layer 54. Thus, the lower insulation layer 50 of the present embodiment is composed of the first insulation layer 52 and the second insulation layer 54.

Following this, at least a portion of the lower insulation layer 50 above the p-electrode 40 as well as a portion thereof above the n-electrode 42 are removed using the photolithography technique and etching technique. Here, the via 50b is formed above the n-electrode 42 so that the lower insulation layer 50 remains on the side surfaces of the n-side cladding layer 24, the light-emitting layer 25, the p-side cladding layer 26, the p-side contact layer 28 and the transparent conductive layer 30. This results in forming a via-containing substrate having the via 50a above the p-electrode 40 and the via 50b above the n-electrode 42 (FIG. 2B(c), a via forming process).

FIG. 2C(a) is a vertical cross sectional view after forming p- and n-wirings. Meanwhile, FIG. 2C(b) is a vertical cross sectional view after forming an upper insulation layer. In addition, FIG. 2C(c) is a vertical cross sectional view after forming p-side and n-side bonding electrodes.

Subsequently, by using the vacuum deposition method and the photolithography technique, the p-wiring 70 having the second vertical conducting portion 702 filled inside the via 50a above the p-electrode 40 and having the second planar conducting portion 700 provided on a portion of the surface of the lower insulation layer 50 in contact with the transparent conductive layer 30 is simultaneously formed with the n-wiring 72 having the first vertical conducting portion 722 filled inside the via 50b above the n-electrode 42 and having the first planar conducting portion 720 which is provided on a portion of the surface of the lower insulation layer 50 in contact with the transparent conductive layer 30 as well as in a region different from the region where the p-wiring 70 is provided (FIG. 2C(a), a wiring forming process). The p-wiring 70 and the n-wiring 72 may be formed of respective different materials, and in this case, the p-wiring 70 and the n-wiring 72 are formed not simultaneously but independently.

Next, the upper insulation layer 80 covering the p-wiring 70 and the n-wiring 72, in particular covering the first planar conducting portion 720 and the second planar conducting portion 700, is formed by the vacuum deposition method (FIG. 2C(b), an upper insulation layer forming process). The upper insulation layer 80 can be formed of the same insulating material as the lower insulation layer 50 which is in contact with the transparent conductive layer 30, e.g., $SiO_2$. Following this, a mask of photoresist is provided on the surface of the upper insulation layer 80, and then, the upper insulation layer 80 having a via 80a exposing a portion of the surface of the p-wiring 70 and a via 80b exposing a portion of the surface of the n-wiring 72 is formed. Then, the p-side bonding electrode 90 electrically connected to the p-wiring 70 through the via 80a exposing a portion of the surface of the second planar conducting portion 700 and the n-side bonding electrode 92 electrically connected to the n-wiring 72 through the via 80b exposing a portion of the surface of the first planar conducting portion 720 are simultaneously formed by the photolithography technique and the vacuum deposition method (FIG. 2C(c), a bonding electrode forming process). The p-side bonding electrode 90 and the n-side bonding electrode 92 may be formed of respective different materials, and in this case, the p-side bonding electrode 90 and the n-side bonding electrode 92 are formed not simultaneously but independently.

In the bonding electrode forming process, the p-side bonding electrode 90 and the n-side bonding electrode 92 can be formed by initially forming a barrier layer in the via 80a exposing a portion of the surface of the second planar conducting portion 700 and in the via 80b exposing a portion of the surface of the first planar conducting portion 720 at the same time (a barrier layer forming process) and subsequently forming a solder layer on the formed barrier layer (a solder layer forming process). Alternatively, the p-side bonding electrode 90 and the n-side bonding electrode 92 may be formed not simultaneously but independently. The light-emitting element 1 shown in FIG. 2C(c) is thereby manufactured.

Alternatively, the n-electrode 42 and the p-electrode 40 can be each formed by the sputtering method. In addition, the lower insulation layer 50 in contact with the transparent conductive layer 30 and the upper insulation layer 80 can be formed by a chemical vapor deposition (CVD) method. Then, the light-emitting element 1 formed through the above processes is mounted by flip-chip bonding at a predetermined position on a substrate of ceramic, etc., having a wiring pattern of conductive material preformed thereon. Then, the light-emitting element 1 can be packaged as a light-emitting device by integrally sealing the light-emitting element 1 mounted on the substrate with sealant such as epoxy resin or glass.

Effects of the First Embodiment

The light-emitting element 1 of the present embodiment can be formed such that an electrode in ohmic contact with a compound semiconductor (i.e., the p-electrode 40 and n-electrode 42) is separated, in a thickness direction of the light-emitting element 1, from a wiring for supplying current to the electrode (i.e., the p-wiring 70 and the n-wiring 72) by the lower insulation layer 50 which is in contact with the transparent conductive layer 30. As a result, it is possible to independently provide the plural p-electrodes 40 and the plural n-electrodes 42 on the semiconductor layer, and the p-electrodes 40 can be electrically connected each other by the p-wiring 70 through the via 50a located above each p-electrode 40 and the plural n-electrodes 42 can be electrically connected through the via 50b located above each n-electrode 42. Therefore, according to the light-emitting element 1 of the present embodiment, it is possible to freely design the shape and arrangement of the p-side bonding electrode 90 and the n-side bonding electrode 92 regardless of the shape and arrangement of the p-electrode 40 and n-electrode 42.

In the light-emitting element 1 of the present embodiment, for example, the shape of the n-electrode 42 can be minutely formed and the plural n-electrodes 42 can be dispersively arranged on the surface of the n-side contact layer 22, hence, it is possible to equalize the dispersion of the current to the light-emitting layer 25 by suppressing the increase in the forward voltage, and the light-emitting area of the light-emitting element 1 can be 70% or more of the total area of the light-emitting element 1 in plan view.

Furthermore, in the light-emitting element 1 of the present embodiment, it is possible to uniform distances from the plural n-electrodes 42 to the respective nearest p-electrodes 40 in plan view. As a result, the light intensity and the forward voltage of the light-emitting element 1 can be accurately predicted from the area of the p-electrodes 40 and n-electrodes 42 and a linear distance between the p-electrode 40 and n-electrode 42, etc., and the electrode can be thereby appropriately designed depending on usage environment of the light-emitting element 1.

Second Embodiment

Figure 3:
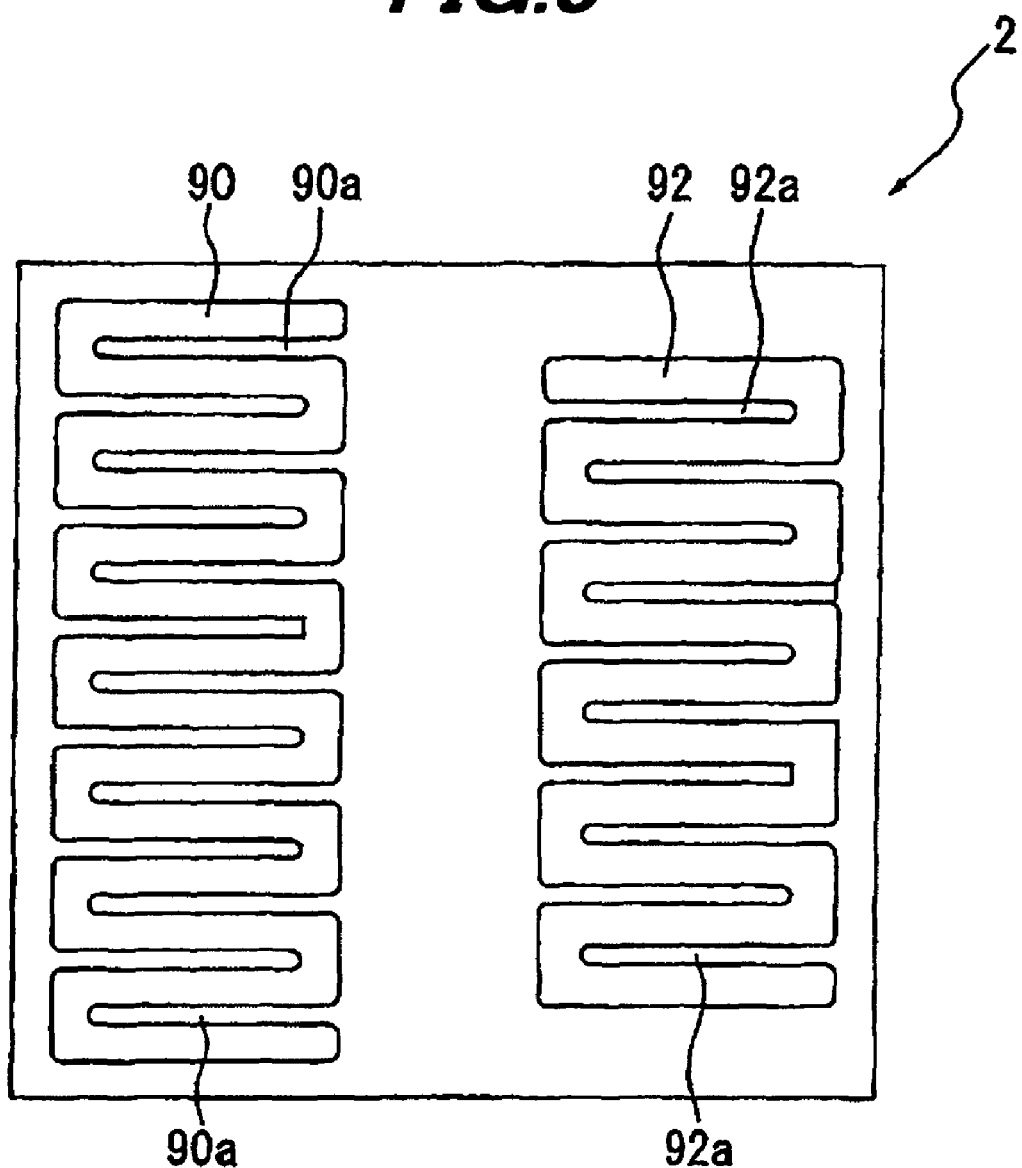
FIG. 3 is a plan view showing a light-emitting element in a second embodiment of the invention.

FIG. 3 schematically shows an upper surface of a light-emitting element in a second embodiment of the invention.

A light-emitting element 2 of the second embodiment has substantially the same structure and function as the light-emitting element 1 of the first embodiment except that the shapes of the p-side bonding electrode 90 and the n-side bonding electrode 92 are different. Thus, the detailed explanation will be omitted except for differences.

The p-side bonding electrode 90 included in the light-emitting element 2 of the second embodiment is formed so as to have p-side notches 90a in plan view and the n-side bonding electrode 92 is formed so as to have n-side notches 92a in plan view. The p-side bonding electrode 90 has, e.g., plural p-side notches 90a arranged alternately in a longitudinal direction, and thus is formed in a serpentine shape. Likewise, the n-side bonding electrode 92 has plural n-side notches 90b arranged alternately in a longitudinal direction, and thus is formed in a serpentine shape. In the light-emitting element 2, since the p-side bonding electrode 90 having the p-side notches 90a and the n-side bonding electrode 92 having the n-side notches 90b are provided, air bubbles associated with fusion of the p-side bonding electrode 90 and the n-side bonding electrode 92 can be released to the outside through the p-side notches 90a and the n-side notches 90b when the light-emitting element 2 is mounted on a predetermined substrate, etc.

Third Embodiment

Figure 4:
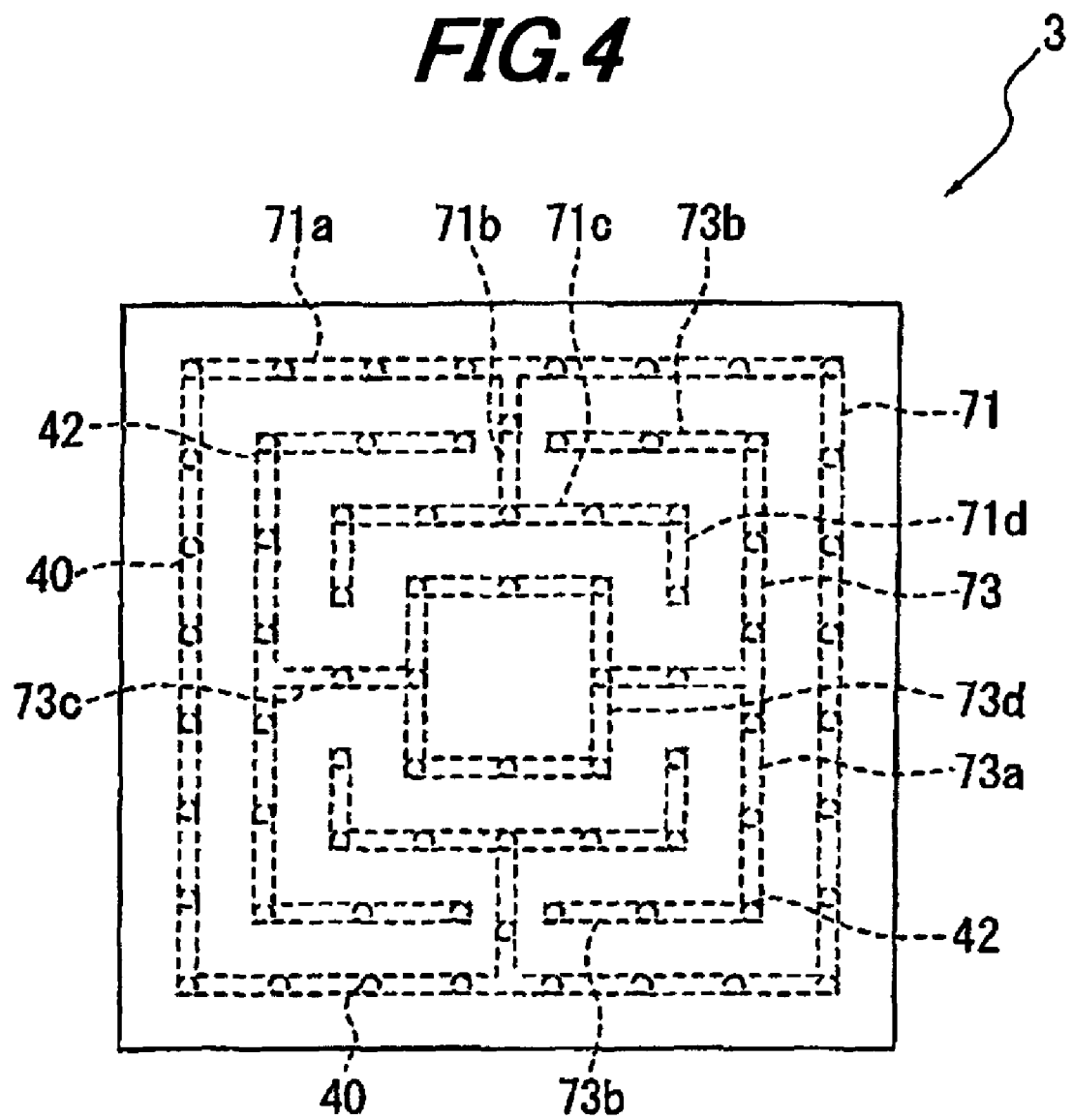
FIG. 4 is a plan view showing a light-emitting element in a third embodiment of the invention.

FIG. 4 schematically shows an upper surface of a light-emitting element in a third embodiment of the invention. It should be noted that illustrations of the p-side and n-side electrodes are omitted in FIG. 4 for convenience of explanation.

A light-emitting element 3 of the third embodiment has substantially the same structure and function as the light-emitting element 1 of the first embodiment except that the shapes of the p-electrode 40 and the n-electrode 42 are different. Thus, the detailed explanation will be omitted except for differences.

In the third embodiment, a p-wiring 71 has an outer peripheral portion 71a provided near and along an outer periphery of the light-emitting element 3 when the light-emitting element 3 is viewed from the top. In addition, the p-wiring 71 has a p-side connecting portion 71b which extends from the vicinity of the center of one side of the outer peripheral portion 71a toward an opposite thereof and has a length of one-quarter of one side of the light-emitting element 3, an intermediate portion 71c which extends in a direction parallel to the above-mentioned one side of the outer peripheral portion 71a and is shorter than the above-mentioned one side, and a p-side end 71d which has about half the length of the p-side connecting portion 71b and extends from both ends of the intermediate portion 71c in a direction perpendicular to and away from the above-mentioned one side.

Meanwhile, an n-wiring 73 has a side portion 73a which has a length shorter than one side of the outer peripheral portion 71a and is provided between the outer peripheral portion 71a and the p-side end 71d, an n-side end 73b which extends from both ends of the side portion 73a toward the center of the light-emitting element 3 in a direction horizontal to the above-mentioned one side, an n-side connecting portion 73c which extends from the vicinity of the center of the side portion 73a toward the center of the light-emitting element 3 in a direction horizontal to the above-mentioned one side, and a central portion 73d which is provided to be connected to an end of the n-side connecting portion 73c and to have a shape surrounding the vicinity of the center of the light-emitting element 3.

The plural p-electrodes 40 are arranged on the transparent conductive layer 30 immediately under the p-wirings 71 at predetermined intervals. Likewise, the plural n-electrodes 42 are arranged on the n-side contact layer 22 immediately under the n-wiring 73 at predetermined intervals.

Prediction of Total Radiant Flux and Forward Voltage

Figure 5:
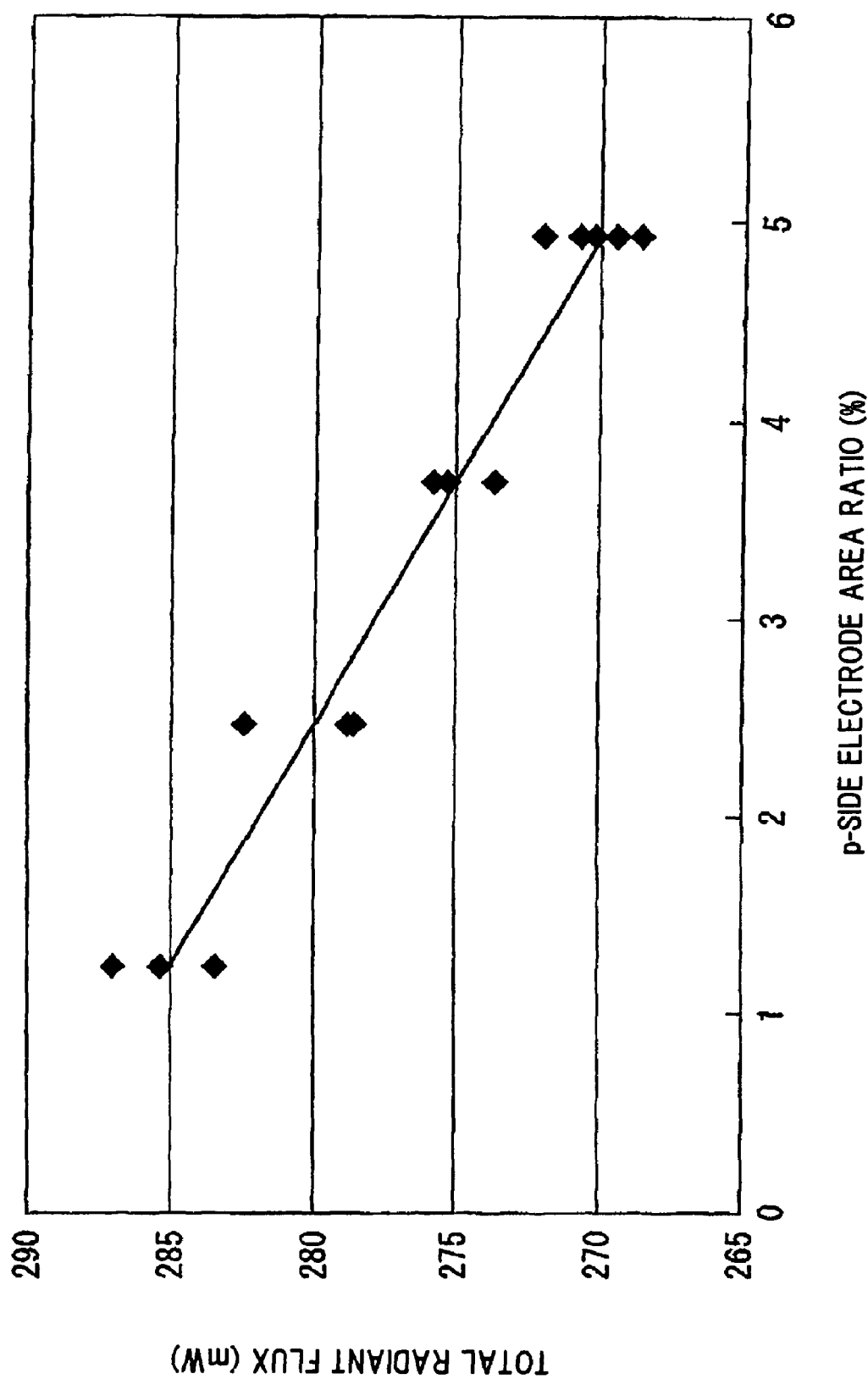
FIG. 5 is a view showing a relation between an area ratio of p-electrode and the total radiant flux of the light-emitting element.
Figure 6:
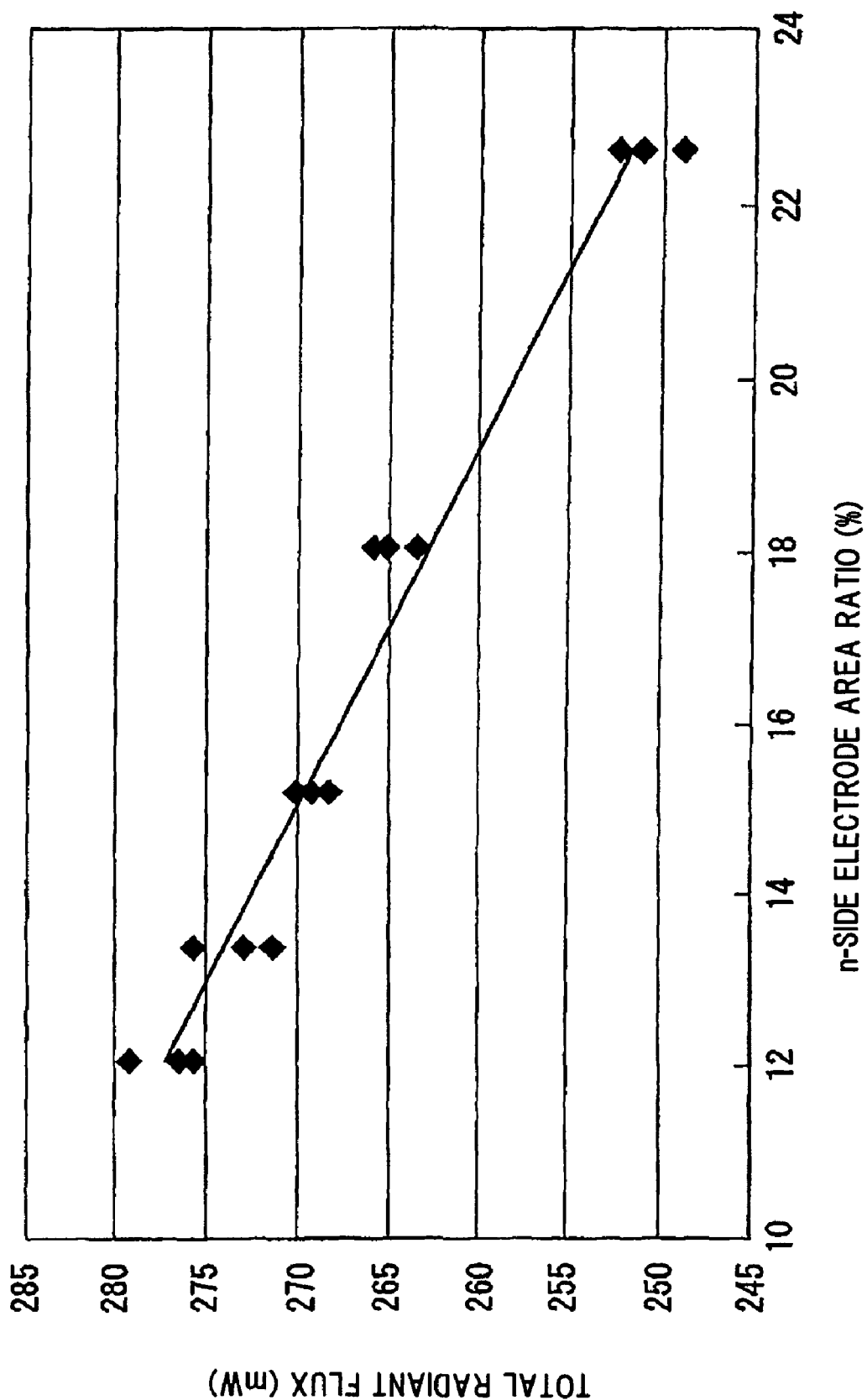
FIG. 6 is a view showing a relation between an area ratio of n-electrode and the total radiant flux of the light-emitting element.
Figure 7:
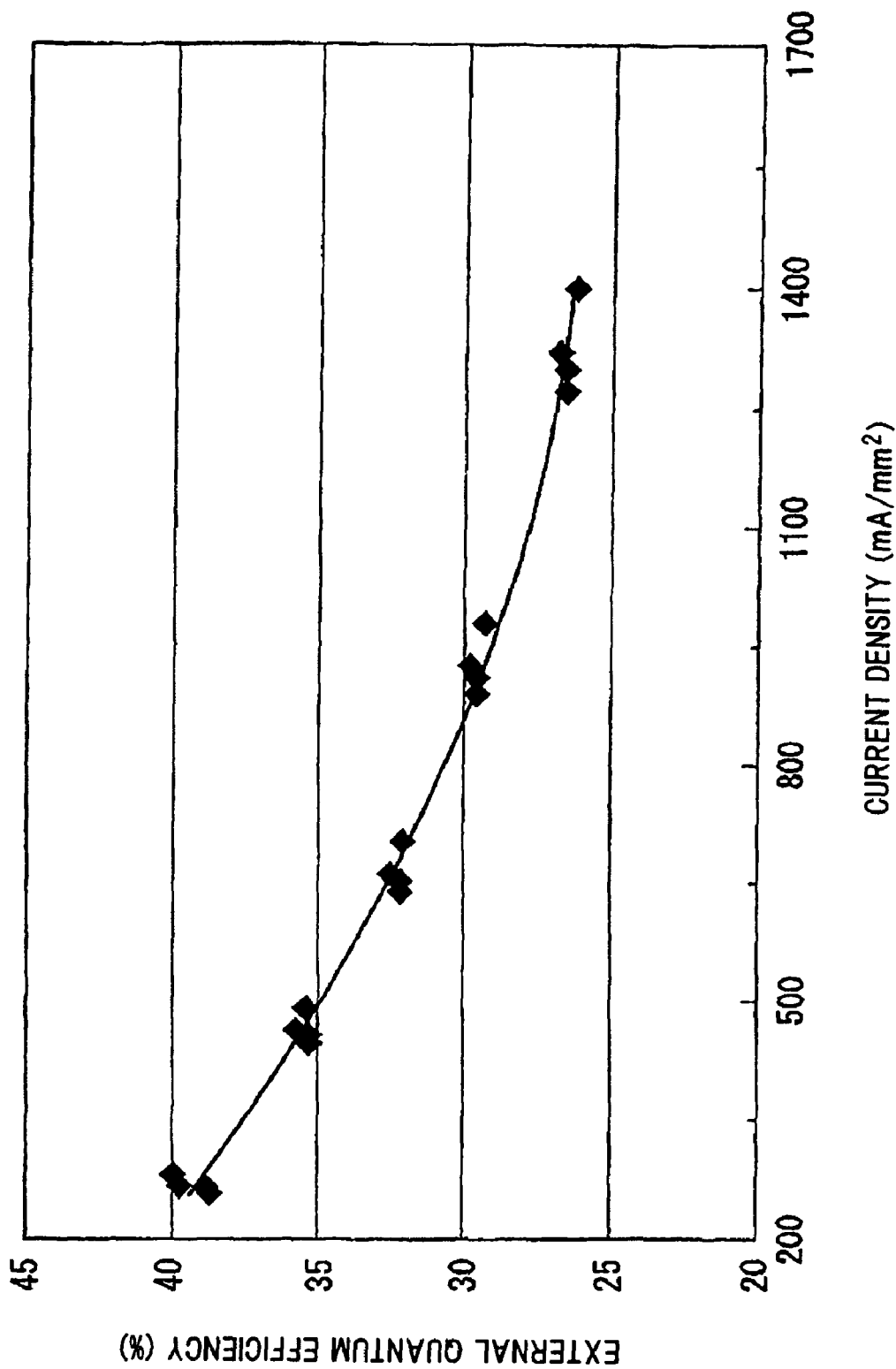
FIG. 7 is a view showing a relation between current density and external quantum efficiency.

FIG. 5 is a view showing a relation between an area ratio of p-electrode and the total radiant flux of the light-emitting element and FIG. 6 is a view showing a relation between an area ratio of n-electrode and the total radiant flux. In addition, FIG. 7 is a view showing a relation between current density and external quantum efficiency.

The total radiant flux of the light-emitting element 1 with variable ratios of the total area of the plural p-electrodes 40 to the total area of the light-emitting element 1 in plan view (hereinafter referred to as "area ratio of p-electrode") (see FIG. 5) and the total radiant flux of the light-emitting element 1 with variable ratios of the total area of the plural n-electrodes 42 to the total area of the light-emitting element 1 in plan view (hereinafter referred to as "area ratio of n-electrode") (see FIG. 6) were measured on the light-emitting element 1 shown in the first embodiment.

As understood by referring to FIGS. 5 and 6, the total radiant flux of the light-emitting element 1 linearly decreased with increasing the area ratio of p-electrode and that of n-electrode. Meanwhile, as understood by referring to FIG. 7, it is shown that external quantum efficiency varies in accordance with quadratic function of current density.

This shows that it is possible to accurately predict the total radiant flux of the light-emitting element 1 based on the area ratio of p-electrode, the area ratio of n-electrode, the external quantum efficiency, emission wavelength and an input current value, and that the light-emitting element 1 with the desired total radiant flux can be obtained by adjusting the area ratio of p-electrode and/or the area ratio of n-electrode. In addition, it was discovered that it is possible to obtain the light-emitting element 1 with the desired forward voltage. In other words, it was discovered that it is possible to predict the forward voltage of the light-emitting element 1 from contact resistance of the p-electrode 40, resistance between the p-electrode 40 and the n-electrode 42, contact resistance of the n-electrode 42 and resistance between the p-wiring 70 and the n-wiring 72.

Figure 8C:
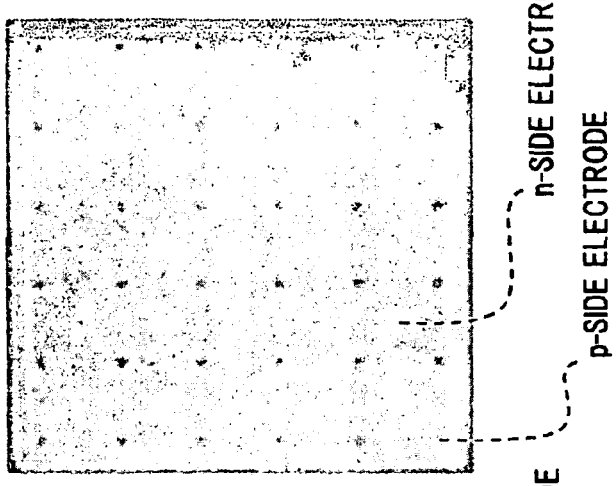
FIG. 8C is a view showing a light-emitting state of a light-emitting element in a modification 1 in which the number of p- and n-electrodes of a light-emitting element 2 is changed.
Figure 8B:
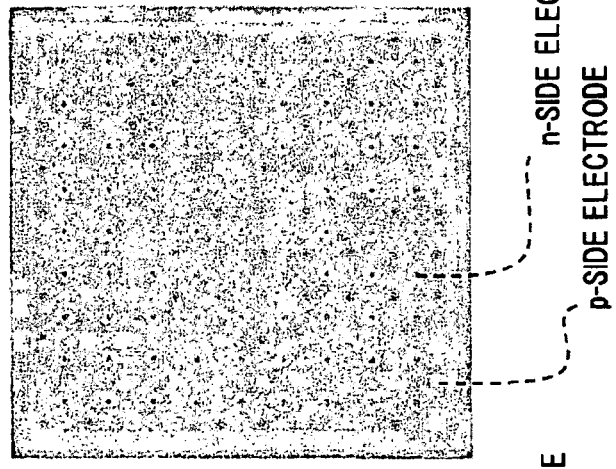
FIG. 8B is a view showing a light-emitting state of a light-emitting element in a modification 1 in which the number of p- and n-electrodes of a light-emitting element 1 is changed.
Figure 8A:
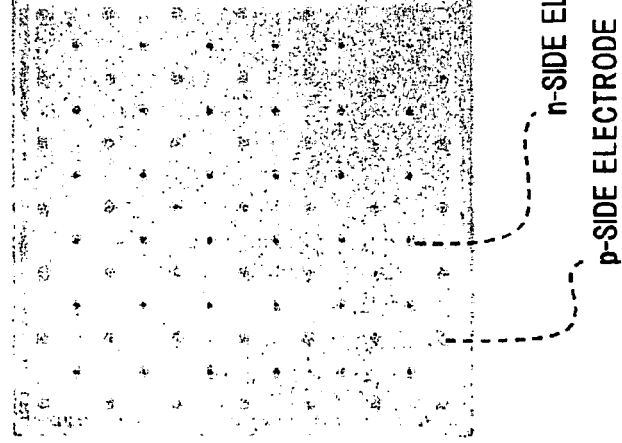
FIG. 8A is a view showing a light-emitting state of the light-emitting element 1.

FIG. 8A is a view showing a light-emitting state of the light-emitting element 1 in the first embodiment, FIG. 8B is a view showing a light-emitting state of a light-emitting element in a modification 1 in which the number of p- and n-electrodes of a light-emitting element 1 is changed and FIG. 8C is a view showing a light-emitting state of a light-emitting element in a modification 2 in which the number of p- and n-electrodes of a light-emitting element 2 is changed.

Figure 9A:
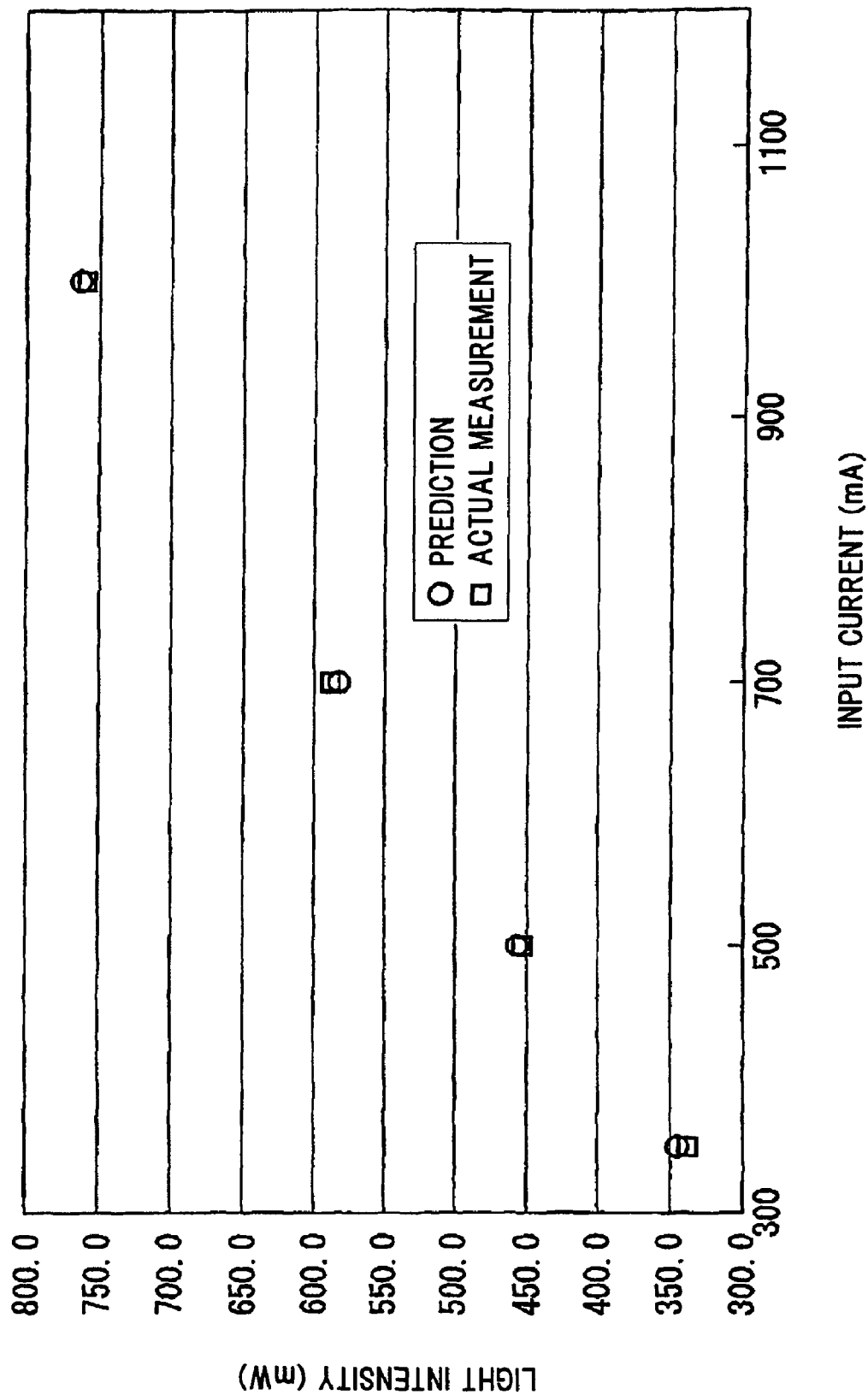
FIG. 9A is a view showing a comparison between a prediction and an actual measurement value of light intensity with respect to an input current to the light-emitting element.

FIG. 9A is a view showing a comparison between a prediction and an actual measurement value of light intensity with respect to an input current to the light-emitting element 1 and FIG. 9B is a view showing a comparison between a prediction and an actual measurement value of forward voltage with respect to an input current to the light-emitting element 1.

In case of injecting current of 350 mA into the light-emitting element 1 (at an emission wavelength of 456 nm), the light intensity was predicted to be 344 mW and the forward voltage was predicted to be 3.14V. The result of the actual measurement in case of injecting current of 350 mA was that the light intensity was 353.3 mW and the forward voltage was 3.13V, which fairly agrees with the prediction. The prediction for other current values also fairly agrees with the actual measurement as shown in FIGS. 9A and 9B. It should be noted that the prediction in case of injecting current of 1000 mA has some minor differences from the actual measurement in FIG. 9B and this is an influence of heat generated by injecting high current.

Figure 10A:
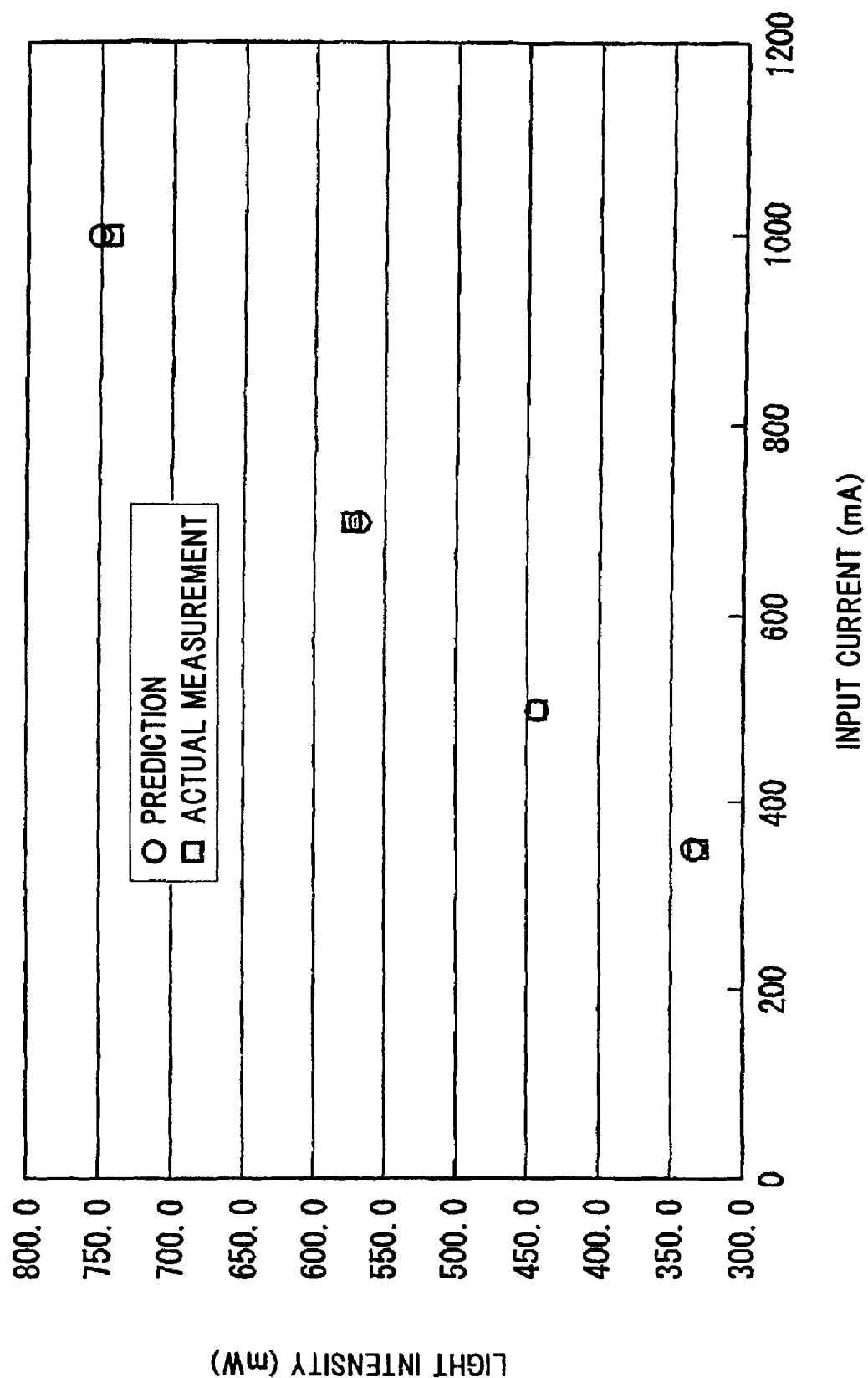
FIG. 10A is a view showing a comparison between a prediction and an actual measurement value of light intensity with respect to an input current to the light-emitting element of the modification 1.

FIG. 10A is a view showing a comparison between a prediction and an actual measurement value of light intensity with respect to an input current to the light-emitting element 1 of the modification 1 and FIG. 10B is a view showing a comparison between a prediction and an actual measurement value of forward voltage with respect to an input current to the light-emitting element 1 of the modification 1.

In case of injecting current of 350 mA into the light-emitting element 1 of the modification 1 (at an emission wavelength of 455.7 nm), the light intensity was predicted to be 335 mW and the forward voltage was predicted to be 3.08V. The result of the actual measurement in case of injecting current of 350 mA was that the light intensity was 344.6 mW and the forward voltage was 3.06V, which fairly agrees with the prediction. The prediction for other current values also fairly agrees with the actual measurement as shown in FIGS. 10A and 10B. It should be noted that the prediction in case of injecting current of 1000 mA has some minor differences from the actual measurement in FIG. 10B and this is an influence of heat generated by injecting high current.

Figure 11B:
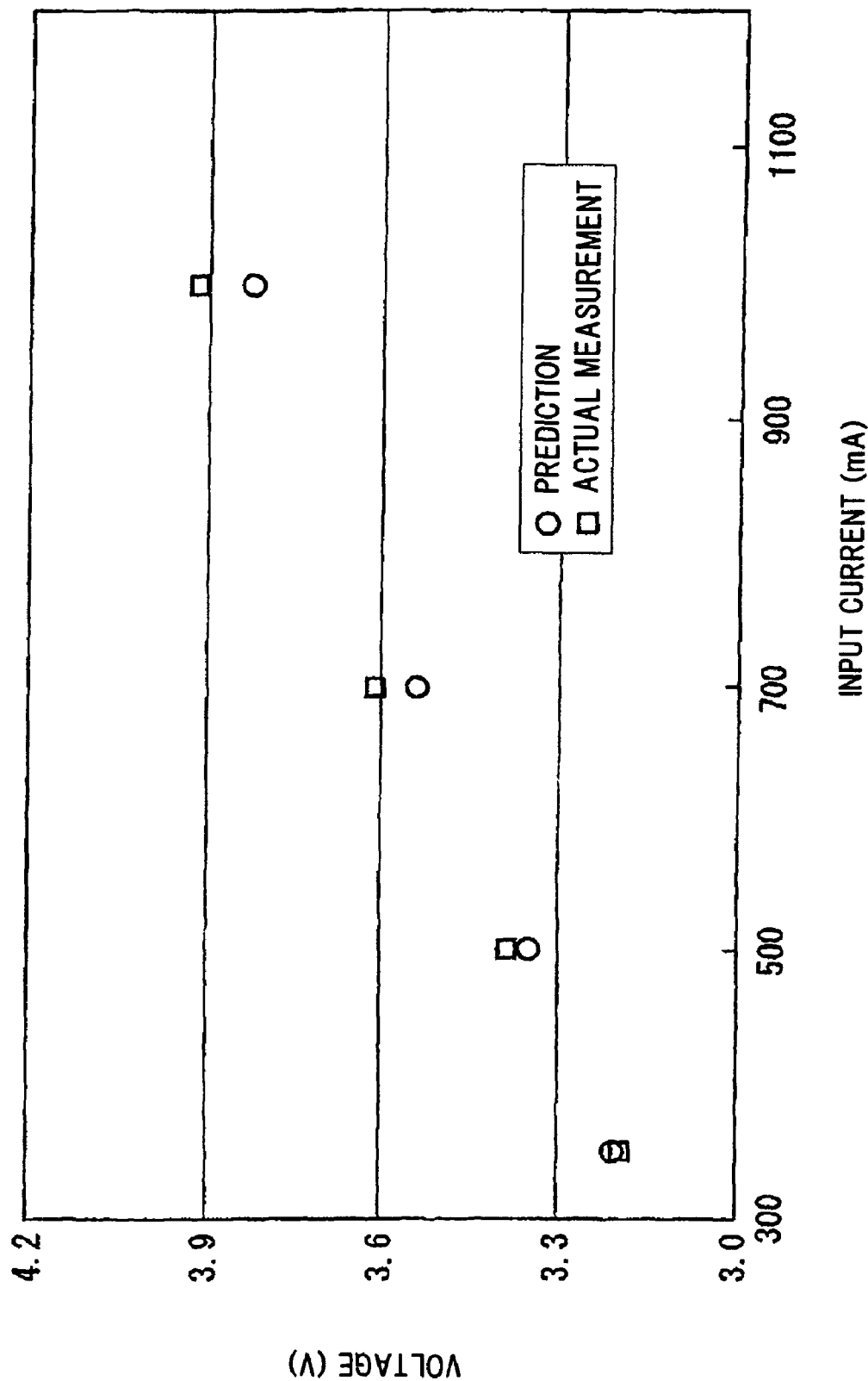
FIG. 11B is a view showing a comparison between a prediction and an actual measurement value of forward voltage with respect to an input current to the light-emitting element of the modification 2.

FIG. 11A is a view showing a comparison between a prediction and an actual measurement value of light intensity with respect to an input current to the light-emitting element 1 of the modification 2 and FIG. 11B is a view showing a comparison between a prediction and an actual measurement value of forward voltage with respect to an input current to the light-emitting element 1 of the modification 2.

In case of injecting current of 350 mA into the light-emitting element 1 of the modification 2 (at an emission wavelength of 455.4 nm), the light intensity was predicted to be 352 mW and the forward voltage was predicted to be 3.29V. The result of the actual measurement in case of injecting current of 350 mA was that the light intensity was 362 mW and the forward voltage was 3.21V, which fairly agrees with the prediction. The prediction for other current values also fairly agrees with the actual measurement as shown in FIGS. 11A and 11B.

Although the embodiments of the invention has been described, the invention according to claims is not to be limited to the above-mentioned embodiments. Further, it should be noted that not all combinations of the features described in the embodiments are not necessary to solve the problem of the invention.

What is claimed is:

1. A light-emitting element, comprising:
  a semiconductor laminated structure comprising a nitride compound semiconductor, a first semiconductor layer of a first conductivity type, a light-emitting layer and a second semiconductor layer of a second conductivity type different from the first conductivity type;
  an insulation layer provided on the semiconductor laminated structure;
  a first wiring comprising a first vertical conducting portion and a first planar conducting portion, the first wiring being electrically connected to the first semiconductor layer, the first vertical conducting portion extending inside the insulation layer, the light-emitting layer and the second semiconductor layer in a vertical direction and the first planar conducting portion extending inside the insulation layer in a planar direction; and
  a second wiring comprising a second vertical conducting portion and a second planar conducting portion, the second wiring being electrically connected to the second semiconductor layer, the second vertical conducting portion extending inside the insulation layer in a vertical direction and the second planar conducting portion extending inside the insulation layer in a planar direction.

2. The light-emitting element according to claim 1, further comprising:
  a first bonding electrode provided on the insulation layer and electrically connected to the first wiring; and
  a second bonding electrode provided on the insulation layer and electrically connected to the second wiring.

3. The light-emitting element according to claim 2, wherein a reflective layer for reflecting light emitted from the light-emitting layer is included inside the insulation layer.

4. The light-emitting element according to claim 3, wherein the first and second planar conducting portions are provided on the same plane.

5. The light-emitting element according to claim 4, wherein the first and second bonding electrodes are provided on the same plane.

6. The light-emitting element according to claim 5, further comprising:
- a first ohmic electrode being in ohmic contact with the first semiconductor layer;
- a transparent conductive layer being in ohmic contact with the second semiconductor layer; and
- a second ohmic electrode being in ohmic contact with the transparent conductive layer,
- wherein the first wiring is electrically connected to the first ohmic electrode; and
- the second wiring is electrically connected to the second ohmic electrode.

7. The light-emitting element according to claim 6 wherein a material comprising the first ohmic electrode is the same as a material comprising the second ohmic electrode.

8. The light-emitting element according to claim 7, wherein a material comprising the first wiring is the same as a material comprising the second wiring.

9. The light-emitting element according to claim 8, wherein the first and second bonding electrodes each have notches in plan view.

10. The fight-emitting element according to claim 3, wherein the first and second planar conducting portions are provided on different planes.

11. The light-emitting element according to claim 10, wherein the first and second bonding electrodes are provided on the same plane.

12. The light-emitting element according to claim 11, further comprising:
- a first ohmic electrode being in ohmic contact with the first semiconductor layer;
- a transparent conductive layer being in ohmic contact with the second semiconductor layer; and
- a second ohmic electrode being in ohmic contact with the transparent conductive layer,
- wherein the first wiring is electrically connected to the first ohmic electrode; and the second wiring is electrically connected to the second ohmic electrode.

13. The light-emitting element according to claim 12 wherein a material comprising the first ohmic electrode is the same as a material comprising the second ohmic electrode.

14. The light-emitting element according to claim 13, wherein a material comprising the first wiring is the same as a material comprising the second wiring.

15. The light-emitting element according to claim 14, wherein the first and second bonding electrodes each have notches in plan view.

16. The light-emitting element according to claim 2, wherein at least one of the first bonding electrode and the second bonding electrode comprises a circular shape.

17. The light-emitting element according to claim 2, wherein at least one of the first bonding electrode and the second bonding electrode comprises a polygonal shape.

18. The light-emitting element according to claim 2, wherein an area of the first bonding electrode is greater than an area of the second bonding electrode.

19. The light-emitting element according to claim 1, wherein the insulation layer comprises an upper insulation layer and a lower insulation layer.

20. The light-emitting element according to claim 1, wherein the first wiring and the second wiring are electrically isolated from one another.

* * * * *

UNITED STATES PATENT AND TRADEMARK OFFICE
CERTIFICATE OF CORRECTION

| | | |
|---|---|---|
| PATENT NO. | : 8,247,823 B2 | Page 1 of 1 |
| APPLICATION NO. | : 12/923384 | |
| DATED | : August 21, 2012 | |
| INVENTOR(S) | : Kosuke Yahata | |

It is certified that error appears in the above-identified patent and that said Letters Patent is hereby corrected as shown below:

In Claim 10 (column 15, line 23), replace "fight-emitting element" with "light-emitting element".

Signed and Sealed this
Thirteenth Day of November, 2012

David J. Kappos
*Director of the United States Patent and Trademark Office*